US012628522B2

(12) United States Patent
Li et al.

(10) Patent No.: US 12,628,522 B2
(45) Date of Patent: May 12, 2026

(54) DISPLAY PANEL AND DISPLAY DEVICE

(71) Applicants:Chengdu BOE Optoelectronics Technology Co., Ltd., Chengdu (CN); BOE TECHNOLOGY GROUP CO., LTD., Beijing (CN)

(72) Inventors: Shuo Li, Beijing (CN); Yanyang Shang, Beijing (CN); Bin Liu, Beijing (CN); Zhenglong Yan, Beijing (CN); Ling Shi, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 414 days.

(21) Appl. No.: 18/289,045

(22) PCT Filed: Feb. 10, 2023

(86) PCT No.: PCT/CN2023/075509
§ 371 (c)(1),
(2) Date: Oct. 31, 2023

(87) PCT Pub. No.: WO2024/164325
PCT Pub. Date: Aug. 15, 2024

(65) Prior Publication Data
US 2025/0089512 A1 Mar. 13, 2025

(51) Int. Cl.
*H10K 59/38* (2023.01)
*H10K 59/122* (2023.01)
(Continued)

(52) U.S. Cl.
CPC .......... *H10K 59/38* (2023.02); *H10K 59/122* (2023.02); *H10K 59/353* (2023.02); *H10K 59/40* (2023.02); *H10K 59/8792* (2023.02)

(58) Field of Classification Search
CPC .... H10K 59/122; H10K 59/353; H10K 59/38; H10K 59/40; H10K 59/8792
See application file for complete search history.

(56) References Cited

U.S. PATENT DOCUMENTS

| | | | |
|---|---|---|---|
| 12,399,593 B2 * | 8/2025 | Seo | H10K 59/40 |
| 2019/0139480 A1 * | 5/2019 | Jin | G09G 3/3208 |
| 2023/0354680 A1 * | 11/2023 | Li | H10K 59/121 |

FOREIGN PATENT DOCUMENTS

| | | | | |
|---|---|---|---|---|
| CN | 107464831 A | * | 12/2017 | H10K 59/353 |
| CN | 108369787 A | * | 8/2018 | G09G 3/2003 |

(Continued)

*Primary Examiner* — Matthew E Warren
(74) *Attorney, Agent, or Firm* — Collard & Roe, P.C.

(57) ABSTRACT
A display panel and a display device are provided. The display panel includes a base substrate, a driving circuit layer, a light-emitting device layer, and a color film layer. Color film patterns of the color film layer includes first color film patterns, second color film patterns and third color film patterns, light-emitting regions of first color sub-pixels and light-emitting regions of second color sub-pixels are alternately arranged along a first direction to form first sub-pixel rows; light-emitting regions of third color sub-pixels are arranged along the first direction to form second sub-pixel rows. The first sub-pixel row includes a middle first sub-pixel, two adjacent second sub-pixel rows, and two outer first sub-pixel rows. The first color film pattern in the middle first sub-pixel row extends across the adjacent second sub-pixel row and further extends to the outer first sub-pixel row.

20 Claims, 17 Drawing Sheets

(51) Int. Cl.
    *H10K 59/35*      (2023.01)
    *H10K 59/40*      (2023.01)
    *H10K 59/80*      (2023.01)

(56)               References Cited

FOREIGN PATENT DOCUMENTS

| | | | | |
|---|---|---|---|---|
| JP | 2023504942 A | * | 2/2023 | ......... H10K 59/1213 |
| WO | WO-2023073481 A1 | * | 5/2023 | ........... H10K 59/876 |
| WO | WO-2023139445 A1 | * | 7/2023 | ............. G02B 27/01 |

* cited by examiner

137

S1

C2

EMT

VNT2

RST1

S21

C1

138

VNT1
RST2
S1
S22

VDD

DT

DISPLAY PANEL AND DISPLAY DEVICE

CROSS REFERENCE TO RELATED APPLICATIONS

The present application is a U.S. National Phase of International Application No. PCT/CN2023/075509 filed on Feb. 10, 2023, which is incorporated herein by reference as a part of the present application.

TECHNICAL FIELD

The present disclosure relates to a display panel and a display device.

BACKGROUND

An organic light-emitting diode (OLED) display device has a series of advantages, such as self-luminescence, high contrast, high definition, wide viewing angle, low power consumption, fast response and low manufacturing cost, etc. It has become one of the key development directions of the new generation of display devices, so it has attracted more and more attention.

SUMMARY

Embodiments of the disclosure provide a display panel and a display device.

At least one embodiment of the disclosure provides a display panel, comprising: a base substrate; a driving circuit layer, disposed on the base substrate and comprising a plurality of pixel driving circuits; a light-emitting device layer, disposed on a side of the driving circuit layer away from the base substrate and comprising a plurality of light-emitting devices; and a color film layer, disposed on a side of the light-emitting device layer away from the base substrate and comprising a plurality of color film patterns, wherein the display panel comprises a plurality of sub-pixels, each of the plurality of sub-pixels comprises at least one pixel driving circuit in the driving circuit layer, at least one light-emitting device in the light-emitting device layer and at least one color film pattern in the color film layer, the plurality of color film patterns comprises a plurality of first color film patterns, a plurality of second color film patterns and a plurality of third color film patterns, so that the plurality of sub-pixels forms a plurality of first color sub-pixels, a plurality of second color sub-pixels and a plurality of third color sub-pixels, light-emitting regions of the plurality of first color sub-pixels and light-emitting regions of the plurality of second color sub-pixels are alternately arranged along a first direction parallel to the base substrate to form a plurality of first sub-pixel rows; light-emitting regions of the plurality of third color sub-pixels are arranged along the first direction to form a plurality of second sub-pixel rows, the first sub-pixel rows and the second sub-pixel rows are alternately arranged along a second direction parallel to the base substrate and intersecting the first direction, the plurality of first sub-pixel rows and the plurality of second sub-pixel rows comprise a sub-pixel row group consisting of one first sub-pixel row, one second sub-pixel row, one first sub-pixel row, one second sub-pixel row and one first sub-pixel row which are sequentially and continuously arranged, the first sub-pixel row in a middle of the sub-pixel row group is a middle first sub-pixel row, the two second sub-pixel rows in the sub-pixel row group are adjacent second sub-pixel rows, and the two outermost first sub-pixel rows in the sub-pixel row group is outer first sub-pixel rows, the first color film pattern of the first color sub-pixel in the middle first sub-pixel row extends across the adjacent second sub-pixel row and further extends to the outer first sub-pixel row.

For example, in the display panel according to an embodiment of the disclosure, the first color film pattern of the first color sub-pixel in the middle first sub-pixel row overlaps with the third color film pattern of a third color sub-pixel, which is closest to the first color sub-pixel, in the adjacent second sub-pixel row, and overlaps with the second color film pattern of a second color sub-pixel, which is closest to the first color sub-pixel, in the outer first sub-pixel row.

For example, in the display panel according to an embodiment of the disclosure, the first color film pattern of the first color sub-pixel in the middle first sub-pixel row overlaps with the third color film patterns of two third color sub-pixels in the adjacent second sub-pixel row on a side of the middle first sub-pixel row, and overlaps with the third color film patterns of two third color sub-pixels in the adjacent second sub-pixel row on the other side of the middle first sub-pixel row.

For example, in the display panel according to an embodiment of the disclosure, the first color film pattern of the first color sub-pixel in the middle first sub-pixel row overlaps with the second color film pattern of one second color sub-pixel in the outer first sub-pixel row on a side of the middle first sub-pixel row, and overlaps with the second color film pattern of one second color sub-pixel in the outer first sub-pixel row on the other side of the middle first sub-pixel row.

For example, in the display panel according to an embodiment of the disclosure, the first color film pattern of each of the plurality of first color sub-pixels in the middle first sub-pixel row is continuously distributed.

For example, in the display panel according to an embodiment of the disclosure, in the sub-pixel row group, a straight line along the second direction and passing through a center of the first color film pattern in the middle first sub-pixel row passes through the second color film pattern in the outer first sub-pixel row, a straight line along the second direction and passing through a center of the second color film pattern in the middle first sub-pixel row passes through the first color film pattern in the outer first sub-pixel row.

For example, in the display panel according to an embodiment of the disclosure, in the sub-pixel row group, a straight line along the second direction and passing through a center of the third color film pattern in the adjacent second sub-pixel row is located between the first color film pattern and the second color film pattern in the outer first sub-pixel row and also between the first color film pattern and the second color film pattern in the middle first sub-pixel row.

For example, in the display panel according to an embodiment of the disclosure, in the sub-pixel row group, the first color film pattern of the first color sub-pixel in the middle first sub-pixel row extends to between the light-emitting regions of a second color sub-pixel and a third color sub-pixel adjacent to each other and located in the adjacent second sub-pixel row and the outer first sub-pixel row.

For example, in the display panel according to an embodiment of the disclosure, in the sub-pixel row group, in a direction parallel to a line connecting centers of the light-emitting regions of the second color sub-pixel and the third color sub-pixel adjacent to each other and located in the adjacent second sub-pixel row and the outer first sub-pixel row, a minimum dimension of a part of the first color film pattern located between the light-emitting regions of the second color sub-pixel and the third color sub-pixel adjacent to each other and located in the adjacent second sub-pixel row and the outer first sub-pixel row is greater than or equal to 7 μm.

For example, in the display panel according to an embodiment of the disclosure, in the sub-pixel row group, a line connecting centers of the light-emitting regions of the second color sub-pixel and the third color sub-pixel adjacent to each other does not overlap with the first color film pattern.

For example, in the display panel according to an embodiment of the disclosure, in an overlapping region of the first color film pattern and the third color film pattern, the first color film pattern is located on a side of the second color film pattern away from the base substrate, in an overlapping region of the first color film pattern and the third color film pattern, the first color film pattern is located on a side of the third color film pattern away from the base substrate.

For example, in the display panel according to an embodiment of the disclosure, the first color sub-pixel is a red sub-pixel, the second color sub-pixel is a blue sub-pixel and the third color sub-pixel is a green sub-pixel.

For example, in the display panel according to an embodiment of the disclosure, in the sub-pixel row group, an overlapping region of the first color film pattern and the second color film pattern comprises a strip-shaped region extending along an edge of the second color film pattern, an overlapping region of the first color film pattern and the third color film pattern comprises a strip-shaped region extending along an edge of the third color film pattern.

For example, in the display panel according to an embodiment of the disclosure, orthographic projections of the second color film pattern and the third color film pattern on the base substrate are substantially circular, a boundary of an overlapping region of the first color film pattern and the third color film pattern facing a center of the third color film pattern is an are, and a boundary of the overlapping region of the first color film pattern and the second color film pattern facing a center of the second color film pattern is an arc.

For example, the display panel according to an embodiment of the disclosure further includes: a black matrix layer, disposed on a side of the light-emitting device layer away from the base substrate, wherein the black matrix layer comprises a plurality of avoidance openings that respectively expose the light-emitting regions of the light-emitting devices of the plurality of sub-pixels in a direction perpendicular to the base substrate, and the plurality of avoidance openings comprise a plurality of first avoidance openings, a plurality of second avoidance openings and a plurality of third avoidance openings that respectively correspond to the plurality of first color sub-pixels, the plurality of second color sub-pixels and the plurality of third color sub-pixels, the plurality of first color film patterns, the plurality of second color film patterns and the plurality of third color film patterns of the plurality of color film patterns respectively cover the plurality of first avoidance openings, the plurality of second avoidance openings and the plurality of third avoidance openings.

For example, in the display panel according to an embodiment of the disclosure, a minimum distance between a boundary of an orthographic projection of the color film pattern on the base substrate and a boundary of an orthographic projection of the avoidance opening covered by the color film pattern on the base substrate is greater than or equal to 4 μm.

For example, in the display panel according to an embodiment of the disclosure, the driving circuit layer comprises a plurality of light-transmitting regions, and the black matrix layer further comprises a plurality of light-transmitting openings, each of the plurality of light-transmitting openings is disposed corresponding to at least one of the plurality of light-transmitting regions for transmitting light having a predetermined angle range relative to the display panel and required for a photosensitive device arranged on a non-display side of the display panel, the light-transmitting opening is located between the first avoidance opening; and the second avoidance opening adjacent in the first direction.

For example, in the display panel according to an embodiment of the disclosure, in a direction perpendicular to the base substrate, the color film pattern does not overlap with the light-transmitting opening.

For example, in the display panel according to an embodiment of the disclosure, in the sub-pixel row group, a part of the first color film pattern of the first color sub-pixel in the middle first sub-pixel row extends to between the light-transmitting opening and the light-emitting region of the third color sub-pixel adjacent to each other, and the part of the first color film pattern overlaps with the third color film pattern of the third color sub-pixel in the second direction.

For example, in the display panel according to an embodiment of the disclosure, a minimum distance between a boundary of an orthographic projection of the color film pattern on the base substrate and a boundary of an orthographic projection of the light-transmitting opening on the base substrate is greater than or equal to 1.3 μm.

For example, the display panel according to an embodiment of the disclosure further includes: a planarization layer disposed on a side of the driving circuit layer away from the base substrate and a pixel defining layer disposed on a side of the planarization layer away from the base substrate, wherein the pixel defining layer comprises a plurality of sub-pixel openings and a plurality of photosensitive openings, the light-emitting device comprises a first electrode layer, a luminescent material layer and a second electrode layer which are sequentially laminated in a direction away from the base substrate, the first electrode layer is disposed on a side of the planarization layer away from the base substrate, the pixel defining layer is disposed on a side of the first electrode layer away from the base substrate, and the plurality of sub-pixel openings respectively expose the first electrode layers of the light-emitting devices of the plurality of sub-pixels, and the plurality of sub-pixel openings define the light-emitting regions of the plurality of sub-pixels, for one sub-pixel opening and one avoidance opening both corresponding to one same sub-pixel, an orthographic projection of the sub-pixel opening on the base substrate is located inside an orthographic projection of the avoidance opening on the base substrate, for one photosensitive opening and one light-transmitting opening both corresponding to one same light-transmitting region, an orthographic projection of the photosensitive opening on the base substrate is located inside an orthographic projection of the light-transmitting opening on the base substrate.

For example, in the display panel according to an embodiment of the disclosure, a minimum distance between a boundary of the orthographic projection of the photosensitive opening on the base substrate and a boundary of the orthographic projection of the light-transmitting opening on the base substrate is greater than or equal to 1 μm.

For example, in the display panel according to an embodiment of the disclosure, the plurality of sub-pixel openings comprise a plurality of first color sub-pixel openings corresponding to the plurality of first color sub-pixels, a plurality of second color sub-pixel openings corresponding to the plurality of second color sub-pixels, and a plurality of third color sub-pixel openings corresponding to the plurality of third color sub-pixels, an orthographic projection of the first color sub-pixel opening on the base substrate is substantially elliptical, the first sub-pixel rows comprise a first type of first sub-pixel row, and an ellipse long axis of the first color sub-pixel opening in the first type of first sub-pixel row extends substantially along the first direction, in the first type of first sub-pixel row, two photosensitive openings both adjacent to the first color sub-pixel opening are symmetrical about a straight line where an ellipse short axis of the first color sub-pixel opening is located, and two photosensitive openings both adjacent to the second color sub-pixel opening are symmetrical about a straight line along the second direction and passing through a center of the second color sub-pixel opening.

For example, in the display panel according to an embodiment of the disclosure, the first sub-pixel rows comprise a second type of first sub-pixel row, and an ellipse long axis of the first color sub-pixel opening in the second type of first sub-pixel row extends substantially along the second direction, in the second type of first sub-pixel row, two photosensitive openings both adjacent to the second color sub-pixel opening are symmetrical about a straight line along the second direction and passing through a center of the second color sub-pixel opening.

For example, in the display panel according to an embodiment of the disclosure, a maximum dimension of the photosensitive opening between the sub-pixels in the second type of first sub-pixel row in the first direction is greater than a maximum dimension of the photosensitive opening between the sub-pixels in the first type of first sub-pixel row in the first direction.

For example, in the display panel according to an embodiment of the disclosure, an opening area of the second color sub-pixel opening is larger than an opening area of the first color sub-pixel opening, a minimum distance between an edge of the photosensitive opening close to the first color sub-pixel opening and the light-transmitting region corresponding to the photosensitive opening is smaller than a minimum distance between an edge of the photosensitive opening close to the second color sub-pixel opening and the light-transmitting region corresponding to the photosensitive opening.

For example, the display panel according to an embodiment of the disclosure further includes: a touch layer, arranged on a side of the pixel defining layer away from the base substrate, the touch layer comprises a plurality of touch lines, and orthographic projections of the plurality of touch lines on the base substrate are staggered from the orthographic projections of the plurality of avoidance opening and the orthographic projections of the plurality of light-transmitting opening on the base substrate, and the plurality of touch lines are arranged crosswise to form a mesh structure, a minimum distance between a boundary of the orthographic projection of the touch line on the base substrate and a boundary of the orthographic projection of the light-transmitting opening on the base substrate is greater than or equal to 1.7 μm, and a minimum distance between the boundary of the orthographic projection of the touch line on the base substrate and a boundary of the orthographic projection of the avoidance opening on the base substrate is greater than or equal to 1.7 μm.

At least one embodiment of the disclosure provides a display device, comprising the display panel according to any items as mentioned above.

For example, the display device according to an embodiment of the disclosure further includes: a photosensitive device located on a non-display side of the display panel, and the photosensitive device is configured to emit light to a display side of the display panel through a light-transmitting region of the driving circuit layer, and/or receive light transmitted from the display side of the display panel to the non-display side of the display panel through the light-transmitting region of the driving circuit layer.

By extending the first color film pattern, the area of the first color film pattern can be increased, thereby better absorbing the light entering the display panel and reducing the reflectivity of the display panel to external light, resulting in better display performance of the display panel.

BRIEF DESCRIPTION OF DRAWINGS

In order to more clearly illustrate the technical solutions of the embodiments of the present disclosure, the accompanying drawings of the embodiments will be briefly introduced below. It is apparent that the accompanying drawings described below only relate to some embodiments of the present disclosure, and are not limitations of the present disclosure.

DETAILED DESCRIPTION

Figure 1A:
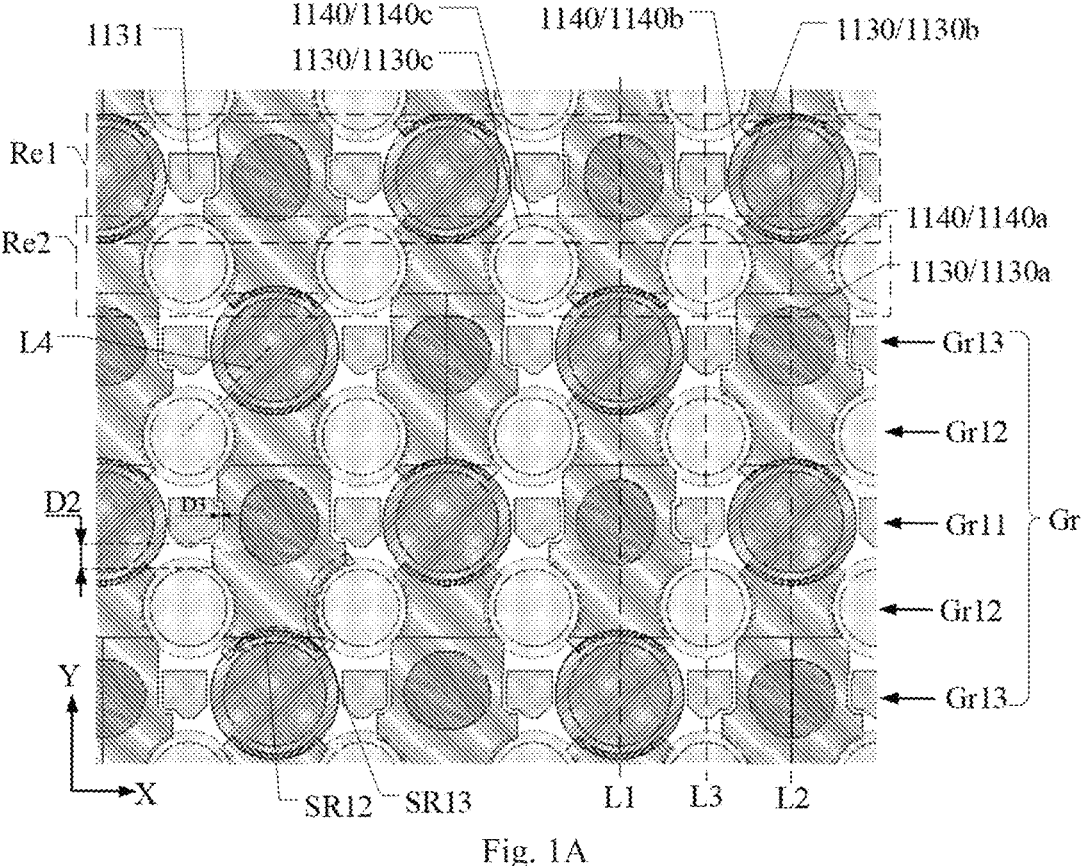
FIG. 1A is a schematic plan view of a laminating layer of a black matrix layer and a color film layer in a display panel provided by at least one embodiment of the present disclosure.

In order to make the objectives, technical solutions, and advantages of the embodiments of the present disclosure clearer, the technical solutions of the embodiments of the present disclosure will be clearly and completely described below in conjunction with the accompanying drawings of the embodiments of the present disclosure. It is apparent that the described embodiments are part of the embodiments of the present disclosure, not all of the embodiments. Based on the described embodiments of the present disclosure, all other embodiments obtained by those skilled in the art without creative labor are within the scope of protection of the present disclosure.

Unless otherwise defined, technical terms or scientific terms used in this disclosure shall have the usual meaning understood by those of ordinary skill in the art to which this disclosure belongs. The use of the words "first", "second", and similar words in this disclosure does not indicate any order, quantity, or importance, but is only used to distinguish different components. The words "including" or "comprising" and similar words mean that the elements or objects appearing before the word cover the elements or objects listed after the word and their equivalents, without excluding other elements or objects. The words "connected" or "connecting" and similar words are not limited to physical or mechanical connections, but can include electrical connections, whether direct or indirect.

Unless otherwise defined, the features of "parallel", "vertical" and "identical" used in the embodiments of the present disclosure include the strict sense of "parallel" "vertical" and "identical", as well as the situations involving certain errors such as "substantially parallel", "substantially vertical" and "substantially identical". For example, the above-mentioned "substantially" can indicate that the difference value of the compared object is within 10% or 5% of the average value of the compared object. When the number of a component or element is not specifically indicated in the following embodiments of the present disclosure, it means that the component or element can be one or more, or can be understood as at least one. "At least one" refers to one or more, and "more than one" refers to at least two. The "arranged in the same layer" in the embodiments of the present disclosure refers to the relationship between multiple film layers formed by the same material after the same step (e.g., a one-step patterning process). Here, "in the same layer" does not always refer to the thickness of multiple film layers being the same or the height of multiple film layers being the same in the cross-sectional view.

In order to prevent the screen from reflecting light, the traditional OLED display panel usually sticks a layer of polarizer on the display panel to improve the comfort of the display panel under ambient light. However, the transmittance of polarizer is usually only about 40%, which leads to low light extraction rate of display panel and high-power consumption of display panel.

In some embodiments, COE (Color film On Encapsulation) technology can be adopted, that is to say, CF (Color film) technology can be used instead of polarizer to improve the light extraction rate of the display panel, and this technology is conducive to the development of the display panel towards high integration and thinness. In COE technology, a black matrix layer is formed on the display panel, and the black matrix layer has an avoidance opening corresponding to a light-emitting region of a light-emitting device of a sub-pixel so as to transmit the light emitted by the light-emitting device of the sub-pixel. The color film arranged at the avoidance opening not only can realize the light-filtering function, but also can absorb light incident to the display panel, reduce the reflectivity of the display panel to external light, and improve the display effect of the display panel. In some other embodiments, the black matrix layer and the color film may not be arranged at the same time, and only the black matrix layer or the color film is arranged. For example, there is no need to set the black matrix layer in the display panel, and color films of different colors are superimposed on each other to for a color film layer, and the light emitted by the light-emitting devices of the sub-pixels passes through the color film layer, and the color film realizes the light-filtering function and absorbs the light incident to the display panel. For example, the color film layer may not be provided in the display panel, and the black matrix layer may be, for example, a gray light-filtering film, so that the light incident to the display panel can be absorbed.

The embodiment of the present disclosure provides a display panel and a display device. The display panel includes a base substrate, a driving circuit layer arranged on the base substrate, a light-emitting device layer arranged on a side of the driving circuit layer away from the base substrate, and a color film layer arranged on a side of the light-emitting device layer away from the base substrate. The driving circuit layer includes a plurality of pixel driving circuits, the light-emitting device layer includes a plurality of light-emitting devices, and the color film layer includes a plurality of color film patterns. The display panel includes a plurality of sub-pixels, each of the plurality of sub-pixels includes at least one pixel driving; circuit in the driving circuit layer, at least one light-emitting device in the light-emitting device layer and at least one color film pattern in the color film layer.

The plurality of color film patterns include a plurality of first color film patterns, a plurality of second color film patterns and a plurality of third color film patterns, so that the plurality of sub-pixels become a plurality of first color sub-pixels, a plurality of second color sub-pixels and a plurality of third color sub-pixels. Light-emitting regions of the plurality of first color sub-pixels and light-emitting regions of the plurality of second color sub-pixels are alternately arranged along a first direction parallel to the base substrate to form a plurality of first sub-pixel rows. Light-emitting regions of the plurality of third color sub-pixels are arranged along the first direction to form a plurality of second sub-pixel rows. The first sub-pixel rows and the second sub-pixel rows are alternately arranged along a second direction parallel to the base substrate and intersecting the first direction.

The plurality of first sub-pixel rows and the plurality of second sub-pixel rows comprise a sub-pixel row group including one first sub-pixel row, one second sub-pixel row, one first sub-pixel row, one second sub-pixel row and one first sub-pixel row which are sequentially and continuously arranged, the first sub-pixel row in a middle of the sub-pixel row group is a middle first sub-pixel row, two second sub-pixel rows in the sub-pixel row group are adjacent second sub-pixel rows, and two outermost first sub-pixel rows in the sub-pixel row group is outer first sub-pixel rows. The first color film pattern of the first color sub-pixel in the middle first sub-pixel row extends across the adjacent second sub-pixel row and further extends to the outer first sub-pixel row. By extending the first color film pattern, an area of the first color film pattern can be increased, so that the light incident to the display panel can be better absorbed, the reflectivity of the display panel to external light can be better reduced, and the display effect of the display panel is better.

It should be noted that when it is explained that the first color film pattern extends across or to a sub-pixel pixel row, the sub-pixel row can be regarded as a strip-shaped region extending along a row direction. For example, the first sub-pixel row may be a strip-shaped region extending along the first direction, and upper and lower boundaries of the strip-shaped region pass through end points of the second color film pattern of the second color sub-pixel that are opposite to each other in the second direction. The second sub-pixel row may be a strip-shaped region extending along the first direction, and upper and lower boundaries of the strip-shaped region pass through end points of the third color film pattern of the third color sub-pixel that are opposite to each other in the second direction. Under this definition, the first sub-pixel row and the second sub-pixel row may partially overlap. In addition, extending to a sub-pixel pixel row can be extending to the boundary of the strip-shaped region, or extending into inside of the strip-shaped region.

Hereinafter, the display panel and the display device provided by the embodiments of the present disclosure will be described in detail with reference to the accompanying drawings.

Figure 1B:
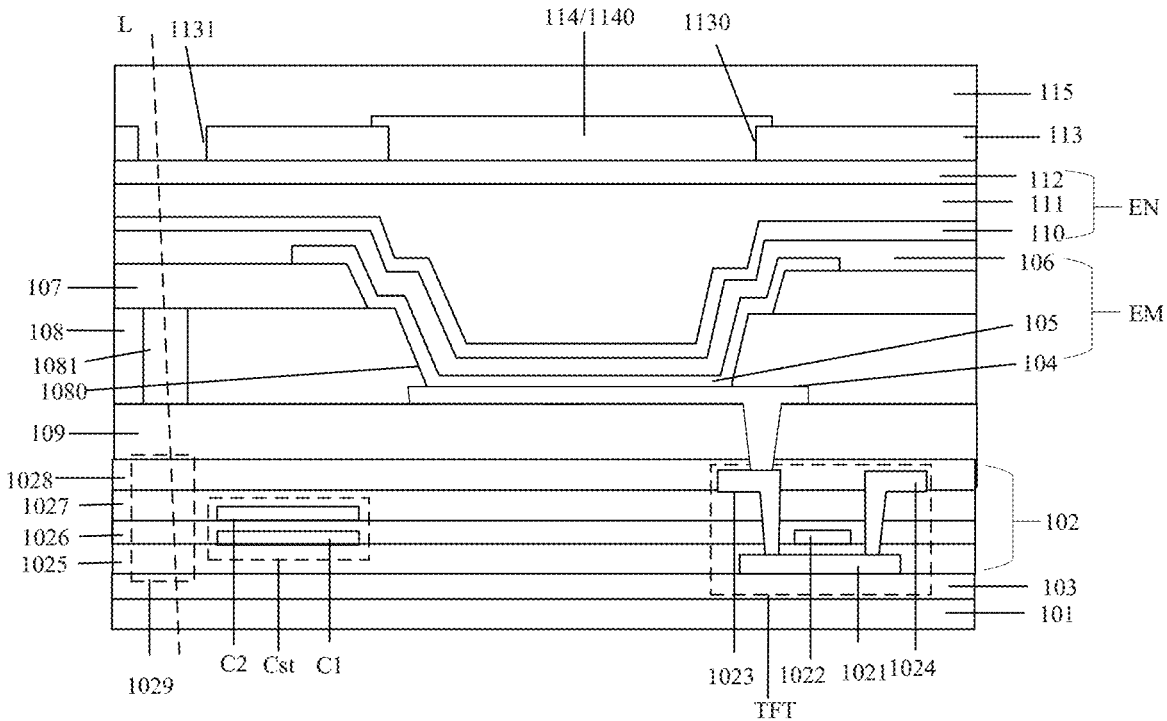
FIG. 1B is a schematic cross-sectional view of a display panel provided by at least one embodiment of the present disclosure.

An embodiment of the present disclosure provides a display panel. FIG. 1A is a schematic plan view of a laminating layer of a black matrix layer and a color film layer in the display panel provided by at least one embodiment of the present disclosure; FIG. 1B is a schematic cross-sectional view of the display panel provided by at least one embodiment of the present disclosure. As illustrated by FIGS. 1A and 1B, the display panel includes a base substrate 101, a driving circuit layer 102 arranged on the base substrate 101, a light-emitting device layer arranged on a side of the driving circuit layer 102 away from the base substrate 101, and a color film layer 114 arranged on a side of the light-emitting device layer away from the base substrate 101. The driving circuit layer 102 includes a plurality of pixel driving circuits, the light-emitting device layer includes a plurality of light-emitting devices EM, and the color film layer 114 includes a plurality of color film patterns 1140. The display panel includes a plurality of sub-pixels, each of the plurality of sub-pixels includes at least one pixel driving circuit in the driving circuit layer, at least one light-emitting device EM in the light-emitting device layer and at least one color film pattern 1140 in the color film layer 114. In order to clearly illustrate the plurality of color film patterns 1140 of the color film layer 114, FIG. 1A only illustrates a part of the structure of the laminating layer of the black matrix layer and the color film layer of the display panel.

For example, as illustrated by FIG. 1B, the pixel driving circuit includes at least one thin film transistor TFT and a storage capacitor Cst, and the thin film transistor TFT includes an active layer 1021, a gate electrode 1022, a source electrode 1024, a drain electrode 1023, and the like arranged on the base substrate 101. The drain electrode 1023 of the thin film transistor TFT is electrically connected to a first electrode layer 104 of the light-emitting device EM. The storage capacitor Cst includes a first capacitor electrode C1 and a second capacitor electrode C2 arranged on the base substrate 101. The first capacitor electrode C1 is arranged on the same layer as the gate electrode 1022, and the second capacitor electrode C2 is arranged on a side of the first capacitor electrode C1 away from the base substrate 101.

For example, as illustrated by FIG. 1B, the display panel may further include a buffer layer 103 arranged on the base substrate 101, a first gate insulating layer 1025 arranged on the active layer 1021, a second gate insulating layer 1026 arranged on the gate electrode 1022 and the first capacitor electrode C1, an interlayer insulating layer 1027 arranged on the second capacitor electrode C2, and a passivation layer 1028 arranged on the source electrode 1023 and the drain electrode 1024 and other structures.

For example, the pixel driving circuit can be formed into 2T1C (two thin film transistors and one storage capacitor), 6T1C (six thin film transistors and one storage capacitor) and other structures, so as to include a plurality of thin film transistors, which include similar or the same laminated structure as the thin film transistor illustrated by FIG. 1B, in which only the thin film transistor directly connected with the light-emitting device is illustrated, which can be a driving thin film transistor, a light-emitting control thin film transistors or the like.

For example, as illustrated by FIG. 1A, a plurality of color film patterns 1140 include a plurality of first color film patterns 1140a, a plurality of second color film patterns 1140b and a plurality of third color film patterns 1140c, so that a plurality of sub-pixels become a plurality of first color sub-pixels, a plurality of second color sub-pixels and a plurality of third color sub-pixels. For example, a sub-pixel corresponding to the first color film pattern 1140a is a first color sub-pixel, a sub-pixel corresponding to the second color film pattern 1140b is a second color sub-pixel, and a sub-pixel corresponding to the third color film pattern 1140c is a third color sub-pixel. Light emitting regions of the plurality of first color sub-pixels and light-emitting regions of the plurality of second color sub-pixels are alternately arranged along a first direction X parallel to the base substrate 101 to form a plurality of first sub-pixel rows. Light emitting regions of the plurality of third color sub-pixels are arranged along the first direction X to form a plurality of second sub-pixel rows. The first sub-pixel rows and the second sub-pixel rows are alternately arranged along a second direction Y which is parallel to the base substrate 101 and intersecting the first direction X. For example, the second direction Y may be perpendicular to the first direction X.

The plurality of first sub-pixel rows and the plurality of second sub-pixel rows comprise a sub-pixel row group Cr consisting of one first sub-pixel row, one second sub-pixel row, one first sub-pixel row, one second sub-pixel row and one first sub-pixel row which are sequentially and continuously arranged, the first sub-pixel row in a middle of the sub-pixel row group Gr is a middle first sub-pixel row Gr11, two second sub-pixel rows in the sub-pixel row group Cr are adjacent second sub-pixel rows Gr12, and two outermost first sub-pixel rows in an sub-pixel row group Gr is outer first sub-pixel rows Gr13. The first color film pattern 1140a of the first color sub-pixel in the middle first sub-pixel row Gr11 extends across the adjacent second sub-pixel row Gr12 and further extends to the outer first sub-pixel row Gr13. By extending the first color film pattern 1140a, an area of the first color film pattern 1140a can be increased, so that the light incident to the display panel can be better absorbed, the reflectivity of the display panel to external light can be better reduced, and the display effect of the display panel is better.

It should be noted that when it is explained that the first color film pattern 140a extends across or to a sub-pixel pixel row, the sub-pixel row can be regarded as a strip-shaped region extending along a row direction. For example, the first sub-pixel row may be a strip-shaped region extending along the first direction X, and upper and lower boundaries of the strip-shaped region pass through end points of the second color film pattern 1140b of the second color sub-pixel that are opposite to each other in the second direction Y. The second sub-pixel row may be a strip-shaped region extending along the first direction X, and upper and lower boundaries of the strip-shaped region pass through end points of the third color film pattern 1140c of the third color sub-pixel that are opposite to each other in the second direction Y, Under this definition, the first sub-pixel row and the second sub-pixel row may partially overlap. In addition, extending to a sub-pixel pixel row can be extending to the boundary of the strip-shaped region, or extending into the inside of the strip-shaped region. As illustrated by FIG. 1, the first sub-pixel row is a strip-shaped region Re1 extending along the first direction X, and the upper and lower boundaries of the strip-shaped region Re1 in the second direction Y are defined by the two end points of the second color film pattern 1140b of the second color sub-pixel in the first sub-pixel row, which are farthest in the second direction Y, for example, a dimension of the strip-shaped region Re1 in the second direction Y is the largest dimension of all the second color film patterns 1140b in the first sub-pixel row in the second direction Y. The second sub-pixel row is a strip-shaped region Re2 extending along; the first direction X, and the upper and lower boundaries of the strip-shaped region Re2 in the second direction Y are defined by the two end points of the third color film pattern 1140c of the third color sub-pixel in the second sub-pixel row, which are farthest in the second direction Y, for example, a dimension of the strip-shaped region Re2 in the second direction Y is the largest dimension of all the third color film patterns 1140c in the second sub-pixel row in the second direction Y. As mentioned above, the description of the first sub-pixel row and the second sub-pixel row here is suitable for describing the extension range of the first color film pattern, but the embodiments of the present disclosure are not limited to having other meanings for the first sub-pixel row and the second sub-pixel row in other aspects.

In some examples, as illustrated by FIG. 1A, the first color film pattern 1140a of the first color sub-pixel in the middle first sub-pixel row Gr11 overlaps with the third color film pattern 1140c of the third color sub-pixel in the adjacent second sub-pixel row Gr12 which is closest to the first color sub-pixel, and overlaps with the second color film pattern 1140b of a second color sub-pixel in the outer first sub-pixel row Gr13 which is closest to the first color sub-pixel. Therefore, the first color film pattern 1140a overlaps with the second color film pattern 1140b and the third color film pattern 1140c, and the area of the first color film pattern 1140a can be further increased, so that the light incident to the display panel can be better absorbed.

In some examples, as illustrated by FIG. 1A the first color film pattern 1140a of the first color sub-pixel in the middle first sub-pixel row Gr11 overlaps with the third color film patterns 1140c of two third color sub-pixels in the adjacent second sub-pixel row Gr12 on a side of the middle first sub-pixel row Gr11, and overlaps with the third color film patterns of two third color sub-pixels in the adjacent second sub-pixel row Gr12 on the other side of the middle first sub-pixel row Gr11. Therefore, the first color film pattern 1140a can overlap with a plurality of third color film patterns 1140c in the adjacent second sub-pixel rows Gr12 on both sides, and the area of the first color film pattern 1140a can be further increased, so that light incident on the display panel can be better absorbed.

For example, as illustrated by FIG. 1A, two third color sub-pixels in the adjacent second sub-pixel row Gr12 located at one side of the middle first sub-pixel row Gr11 are equidistant from the first color sub-pixel. For example, two third color sub-pixels in the adjacent second sub-pixel row Gr12 located on the other side of the middle first sub-pixel row Gr11 are equidistant from the first color sub-pixel.

In some examples, as illustrated by FIG. 1A the first color film pattern 1140a of the first color sub-pixel in the middle first sub-pixel row Gr11 overlaps with the second color film pattern 1140b of one second color sub-pixel in the outer first sub-pixel row Gr13 on a side of the middle first sub-pixel row Gr11, and overlaps with the second color film pattern 1140b of one second color sub-pixel in the outer first sub-pixel row Gr13 on the other side of the middle first sub-pixel row Gr11. Therefore, the first color film pattern 1140a can overlap with a plurality of second color film patterns 1140b in the outer first sub-pixel rows Gr13 on both sides, and the area of the first color film pattern 1140a can be further increased, so that the light incident to the display panel can be better absorbed.

In some examples, as illustrated by FIG. 1A, the first color film pattern 1140a of each first color sub-pixel in the middle first sub-pixel row Gr11 is continuously distributed. Therefore, the area of the first color film pattern 1140a can be further increased, so that the light incident to the display panel can be better absorbed. For example, as illustrated by FIG. 1A, the plurality of first color film patterns 1140a of the plurality of first color sub-pixels in the middle first sub-pixel row Gr11 are alternately distributed along the first direction X.

In some examples, as illustrated by FIG. 1A, in the sub-pixel row group Gr, a straight line L1 along the second direction Y and passing through a center of the first color film pattern 1140a in the middle first sub-pixel row Gr11 passes through the second color film pattern 1140b in the outer first sub-pixel row Gr13. For example, the first color film patterns 1140a and the second color film patterns 1140b are arranged roughly alternately along the second direction Y. Therefore, according to sizes and dimensions of the light-emitting regions of the light-emitting devices of different sub-pixels, the light-emitting regions of the light-emitting devices of sub-pixels can be arranged more reasonably, so that the area of the first color film pattern 1140a can be made larger.

In some examples, as illustrated by FIG. 1A, in the sub-pixel row group Gr, a straight line L2 along the second direction Y and passing through a center of the second color film pattern 1140b in the middle first sub-pixel row Gr11 passes through the first color film pattern 1140a in the outer first sub-pixel row Gr13.

For example, as illustrated by FIG. 1A, in the sub-pixel row group Gr, the straight line L1 along the second direction Y and passing through the center of the first color film pattern 1140a in the middle first sub-pixel row Gr11 passes through a center of the second color film pattern 1140b in the outer first sub-pixel row Gr13. For example, the straight line L2 along the second direction Y and passing through the center of the second color film pattern 1140b in the middle first sub-pixel row Gr11 passes through a center of the first color film pattern 1140a in the outer first sub-pixel row Gr13.

In some examples, as illustrated by FIG. 1A, in the sub-pixel row group Gr, a straight line L3 along the second direction Y and passing through a center of the third color film pattern 1140c in the adjacent second sub-pixel row Gr12 is located between the first color film pattern 1140a and the second color film pattern 1140b in the outer first sub-pixel row Gr13 and also between the first color film pattern 1140a and the second color film pattern 1140b in the middle first sub-pixel row Gr11. Therefore, the light-emitting regions of the light-emitting devices of sub-pixels can be arranged more reasonably according to the sizes and dimensions of the light-emitting regions of the light-emitting devices of different sub-pixels, so that the area of the first color film pattern 1140a can be made larger.

Figure 2:
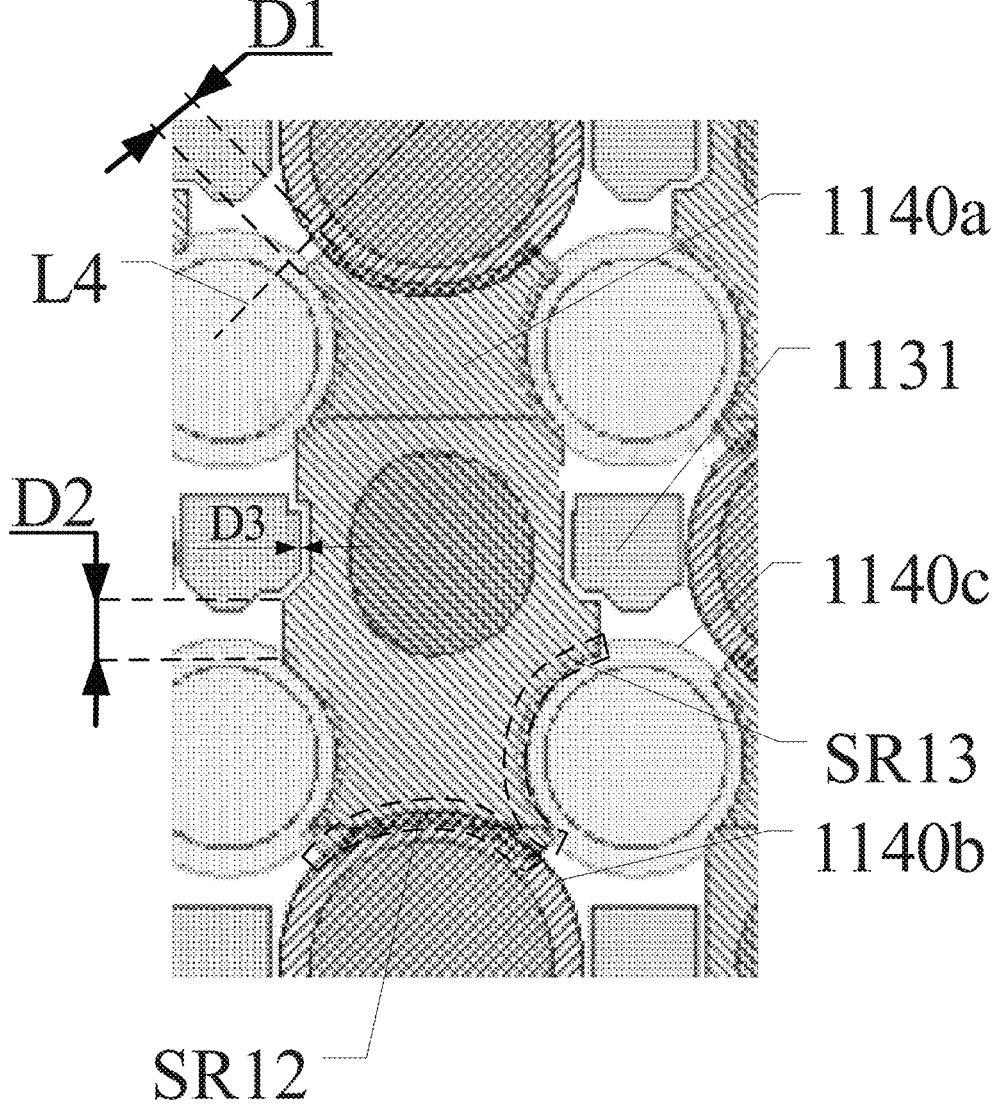
FIG. 2 is a partially enlarged schematic view of FIG. 1A.

FIG. 2 is a partially enlarged schematic view of FIG. 1A. As illustrated by FIGS. 1A and 2, in the sub-pixel row group Gr, the first color film pattern 1140a of the first color sub-pixel in the middle first sub-pixel row Gr11 extends between the light-emitting regions of second color sub-pixel and third color sub-pixel adjacent to each other in the adjacent second sub-pixel row Gr12 and the outer first sub-pixel row Gr13. Therefore, the area of the first color film pattern 1140a can be further increased, so that the light incident on the display panel can be better absorbed.

In some examples, as illustrated by FIGS. 1A and 2, in the sub-pixel row group Gr, in a direction parallel to a line L4 connecting centers of the light-emitting regions of second color sub-pixel and third color sub-pixel adjacent to each other in the adjacent second sub-pixel row Gr12 and the outer first sub-pixel row Gr13, a minimum dimension D1 of a part of the first color film pattern 1140a located between the light-emitting regions of second color sub-pixel and third color sub-pixel adjacent to each other in the adjacent second sub-pixel row Gr12 and the outer first sub-pixel row Gr13 is greater than or equal to 7 μm. Therefore, the process requirements of the color film pattern 1140 can be met, and the area of the first color film pattern 1140a can be maximized.

In some examples, as illustrated by FIGS. 1A and 2, in the sub-pixel row group Gr, the first color film pattern 1140a located between the light-emitting regions of adjacent second color sub-pixel and third color sub-pixel may overlap with both the second color pattern 1140b and third color film pattern 1140c of the adjacent second color sub-pixel and third color sub-pixel. Therefore, the area of the first color film pattern 1140a can be further increased.

In some examples, as illustrated by FIGS. 1A and 2, in the sub-pixel row group Gr, the line L4 connecting centers of the light-emitting regions of adjacent second color sub-pixel and third color sub-pixel does not overlap with the first color film pattern 1140a. Due to the dimension limitation between the second color film pattern 1140b and the third color film pattern 1140c of the adjacent second color sub-pixel and third color sub-pixel, the first color film pattern 1140a does not overlap with the center-connecting line L4. Of course, the embodiment of the present disclosure is not limited thereto. For example, if a dimension between the second color film pattern 1140b and the third color film pattern 1140c of adjacent second color sub-pixel and third color sub-pixel meets the minimum requirement of the color film pattern 1140, the center connecting line L4 of adjacent second color sub-pixel and third color sub-pixel may overlap with the first color film pattern 1140a, so that the area of the first color film pattern 1140a can be further increased. In these examples, because the portion of the first color film pattern 1140a extending between the light-emitting regions of the adjacent second color sub-pixel and third color sub-pixel is located on a side of the center connecting line L4 of the light-emitting regions of the two sub-pixels, therefore, tinder the condition of specific processing accuracy of the first color film pattern 1140a, the first color film pattern 1140a can cover a larger area without affecting adjacent sub-pixels. For example, a space between the light-emitting regions of adjacent second color sub-pixel and third color sub-pixel and passing through the center-connecting line L4 is the narrowest, and even if a dimension of the first color film pattern 1140a is the smallest dimension (characteristic line width) that can be prepared at this spatial position, the normal display of adjacent second color sub-pixel and third color sub-pixel may be affected. Therefore, the first color film pattern 1140a can be prepared to extend to the center-connecting line L4 of the light-emitting regions of the adjacent second color sub-pixel and third color sub-pixel, and then an end of the first color film pattern 1140a at this spatial position can be cut off so that the first color film pattern 1140a does not overlap with the center-connecting line L4, so that the first color film pattern 1140a can cover a larger area without affecting the adjacent sub-pixels. Of course, the first color film pattern 1140a can also be directly prepared, so that the first color film pattern 1140a does not overlap with the center-connecting line L4, so that the first color film pattern 1140a can cover a larger area without affecting adjacent sub-pixels.

In some examples, as illustrated by FIGS. 1A and 2, in the sub-pixel row group Gr, the first color film pattern 1140a of the first color sub-pixel in the middle first sub-pixel row Gr11 extends between the light-emitting regions of the adjacent second color sub-pixels in the adjacent second sub-pixel row Gr12. For example, the adjacent second color sub-pixels may be adjacent in the first direction X or in the second direction Y. Thus, the area of the first color film pattern 1140a can be increased to a greater extent.

In some examples, as illustrated by FIGS. 1A and 2, in an overlapping region of the first color film pattern 1140a and the second color film pattern 1140b, the first color film pattern 1140a is located on a side of the second color film pattern 1140b away from the base substrate 101. In an overlapping region of the first color film pattern 1140a and the third color film pattern 1140c, the first color film pattern 1140a is located on a side of the third color film pattern 1140c away from the base substrate 101.

For example, when preparing the color film pattern 1140, the second color film pattern 1140b may be applied first, then the third color film pattern 1140c may be applied, and finally the first color film pattern 1140a may be applied. For example, the second color film pattern 1140b is a blue color film pattern, the third color film pattern 1140c is a green color film pattern and the first color film pattern 1140a is a red color film pattern. If the first color film pattern 1140a is a red color film pattern, a dark hue of the display panel is darker, thus having a better display effect in the dark state.

In some examples, as illustrated by FIGS. 1A and 2, the first color sub-pixel may be a red sub-pixel, the second color sub-pixel may be a blue sub-pixel, and the third color sub-pixel may be a green sub-pixel.

In some examples, as illustrated by FIGS. 1A and 2, in an overlapping region of the first color film pattern 140a and the second color film pattern 1140b, a distance between a boundary of an orthographic projection of the first color film pattern 1140a on the base substrate 101 and a boundary of an orthographic projection of the second color film pattern 1140b on the base substrate 101 may be 4 μm. Of course, the embodiment of the present disclosure does not limit this, for example, the distance between them can be less than 4 μm, for example, the distance between them can be less than or equal to 2 μm, thus, the influence of the first color film pattern 1140a on the second color sub-pixel can be avoided. For example, the distance between them may be greater than 4 μm, thereby further increasing the area of the first color film pattern 1140a.

In some examples, as illustrated by FIGS. 1A and 2, in an overlapping region of the first color film pattern 1140a and the third color film pattern 1140c, a distance between a boundary of an orthographic projection of the first color film pattern 1140a on the base substrate 101 and a boundary of an orthographic projection of the third color film pattern 1140c on the base substrate 101 may be 4 μm. Of course, the embodiment of the present disclosure does not limit this, for example, the distance between them can be less than 4 μm, for example, the distance between them can be less than or equal to 2 μm, thus, the influence of the first color film pattern 1140*a* to the third color sub-pixel can be avoided. For example, the distance between them may be greater than 4 μm, thereby further increasing the area of the first color film pattern 1140*a*.

In some examples, as illustrated by FIGS. 1A and 2, in the sub-pixel row group Gr, the first color film pattern 1140*a* has a boundary at least partially similar to a boundary of the second color film pattern 1140*b* adjacent to the first color film pattern 1140*a*. For example, at least part of the boundary of the first color film pattern 1140*a* may be parallel to at least part of the boundary of the second color film pattern 1140*b* adjacent to the first color film pattern 1140*a*. Therefore, the area of the first color film pattern 1140*a* can be increased to a greater extent along the boundary of the second color film pattern 1140*b*.

In some examples, as illustrated by FIGS. 1A and 2, in the sub-pixel row group Gr, the overlapping region of the first color film pattern 1140*a* and the second color film pattern 1140*b* overlap each other includes a strip-shaped region SR12 extending along an edge of the second color film pattern 1140*b*. Thus, the area of the first color film pattern 1140*a* can be increased to a greater extent.

In some examples, as illustrated by FIGS. 1A and 2, in the sub-pixel row group Or, the first color film pattern 1140*a* has a boundary at least partially similar to a boundary of the third color film pattern 1140*c* adjacent to the first color film pattern 1140*a*. For example, at least part of the boundary of the first color film pattern 1140*a* may be parallel to at least part of the boundary of the third color film pattern 1140*c* adjacent to the first color film pattern 1140*a*. Therefore, the area of the first color film pattern 1140*a* can be increased to a greater extent along the boundary of the third color film pattern 1140*c*.

In some examples, as illustrated by FIGS. 1A and 2, in the sub-pixel row group Gr, the overlapping region of the first color film pattern 1140*a* and the third color film pattern 1140*c* overlap each other includes a strip-shaped region SR13 extending along an edge of the third color film pattern 1140*c*. Thus, the area of the first color film pattern 1140*a* can be increased to a greater extent.

In some examples, as illustrated by FIGS. 1A and 2, orthographic projections of the second color film pattern 1140*b* and the third color film pattern 1140*c* on the base substrate 101 are substantially circular, a boundary of an overlapping region of the first color film pattern 1140*a* and the third color film pattern 1140*c* facing a center of the third color film pattern 1140*c* is an arc, and a boundary of the overlapping region of the first color film pattern 1140*a* and the second color film pattern 1140*b* facing a center of the second color film pattern 1140*b* is an arc.

In some examples, as illustrated by FIGS. 1A and 2, a plane shape of the first color film pattern 1140*a* is different from a plane shape of the second color film pattern 1140*b*, and a plane shape of the first color film pattern 1140*a* is different from a plane shape of the third color film pattern 1140*c*.

In some examples, as illustrated by FIGS. 1A and 2, the area of the first color film pattern 1140*a* is larger than an area of the second color film pattern 1140*b*, and the area of the first color film pattern 1140*a* is larger than an area of the third color film pattern 1140*c*.

In some examples, as illustrated by FIGS. 1A and 1B, the display panel further includes a black matrix layer 113, and the black matrix layer 113 is arranged on a side of the light-emitting device layer away from the base substrate 101. The black matrix layer 113 includes a plurality of avoidance openings 1130 that respectively expose the light-emitting regions of the light-emitting devices of the plurality of sub-pixels in a direction perpendicular to the base substrate 101, and the plurality of avoidance openings 1130 include a plurality of first avoidance openings 1130*a*, a plurality of second avoidance openings 1130*b* and a plurality of third avoidance openings 130*c* that respectively correspond to the plurality of first color sub-pixels, the plurality of second color sub-pixels and the plurality of third color sub-pixels. The plurality of first color film patterns 1140*a*, the plurality of second color film patterns 1140*b* and the plurality of third color film patterns 1140*c* of the plurality of color film patterns 1140 cover the plurality of first avoidance openings 1130*a*, the plurality of second avoidance openings 1130*b* and the plurality of third avoidance openings 130*c*, respectively. By arranging the black matrix layer 113, the light incident to the display panel can be absorbed, the reflectivity of the display panel to external light can be reduced, and the display effect of the display panel can be improved.

In some examples, as illustrated by FIGS. 1A and 1B, a minimum distance between a boundary of an orthographic projection of the color film pattern 1140 on the base substrate 101 and a boundary of an orthographic projection of the avoidance opening 1130 covered by the color film pattern 1140 on the base substrate 101 is greater than or equal to 4 μm. Therefore, the color film pattern 1140 can better cover the avoidance opening 1130, and the peeling phenomenon of the color film pattern 1140 can be avoided. For example, the color film pattern 1140 may be the first color film pattern 1140*a*, the second color film pattern 1140*b* and the third color film pattern 1140*c*.

In some examples, as illustrated by FIG. 1A, the plurality of first avoidance openings 1130*a* and the plurality of second avoidance openings 1130*b* are alternately arranged along the first direction X parallel to the base substrate 101, and the plurality of third avoidance openings 1130*c* are arranged along the first direction X.

In some examples, as illustrated by FIGS. 1A and 1B, the driving circuit layer 102 of the display panel includes a plurality of light-transmitting regions 1029, and the black matrix layer 113 further includes a plurality of light-transmitting openings 1131, each of the plurality of light-transmitting openings 1131 is arranged corresponding to at least one of the plurality of light-transmitting regions 1029 for transmitting light with a predetermined angle range with the display panel, such as transmitting light L required for a photosensitive device arranged on a non-display side of the display panel. For example, the photosensitive device includes an infrared sensor, a distance sensor, a fingerprint identification module and a brightness level module. The light-transmitting opening 1131 is located between the first avoidance opening 1130*a* and the second avoidance opening 1130*b* adjacent in the first direction X.

In some examples, as illustrated by FIG. 1A, the light-transmitting opening 1131 is located between two second avoidance openings 1130*b* adjacent in the second direction Y.

For example, as illustrated by FIG. 1A, an array of light-transmitting openings 1131 is arranged in rows and columns.

For example, as illustrated by FIG. 1B, the light-transmitting region 1029 of the driving circuit layer 102 includes a light-transmitting insulating material of insulating layers such as the above-mentioned first gate insulating layer 1025, the second gate insulating layer 1026, the interlayer insulating layer 1027, the passivation layer 1028.

In some examples, as illustrated by FIGS. 1A and 1B, in the direction perpendicular to the base substrate 101, the color film pattern 1140 does not overlap with the light-transmitting opening 1131. Therefore, the color film pattern 1140 can be prevented from entering the light-transmitting opening 1131 adjacent to the color film pattern 1140, so as to avoid the influence on the light-transmitting opening 1131. For example, the first color film pattern 1140a does not overlap the light-transmitting opening 1131, the second color film pattern 1140b does not overlap the light-transmitting opening 1131, and the third color film pattern 1140c does not overlap the light-transmitting opening 1131.

In some examples, as illustrated by FIGS. 1A and 2, in the sub-pixel row group Gr, apart of the first color film pattern 1140a of the first color sub-pixel in the middle first sub-pixel row Gr11 extends to between the light-transmitting opening 1131 and the light-emitting region of the third color sub-pixel which are adjacent to each other, and the part of the first color film pattern 1140a overlaps with the third color film pattern 1140c of the third color sub-pixel in the second direction Y. Thereby, the area of the first color film pattern 1140a can be further increased.

For example, as illustrated by FIGS. 1A and 2, in the sub-pixel row group Gr, in the second direction Y, at least part of the first color film pattern 1140a of the first color sub-pixel in the middle first sub-pixel row Gr11 is located between the light-transmitting opening 1131 and the light-emitting region of the third color sub-pixel which are adjacent to each other.

In some examples, as illustrated by FIGS. 1A and 2, in the sub-pixel row group Gr, in the second direction Y, a minimum dimension D2 of a portion of the first color film pattern 1140a of the first color sub-pixel in the middle first sub-pixel row Gr11 between the light-transmitting opening 1131 and the third color sub-pixel adjacent to each other is greater than or equal to 7 μm. Therefore, the process requirements of the color film pattern 1140 can be met, and the area of the first color film pattern 1140a can be maximized.

In some examples, as illustrated by FIGS. 1A and 2, a minimum distance D3 between the boundary of the orthographic projection of the color film pattern 1140 on the base substrate 101 and a boundary of the orthographic projection of the light-transmitting opening 1131 on the base substrate 101 is greater than or equal to 1.3 m.

In some examples, as illustrated by FIGS. 1A and 2, in the sub-pixel row group Gr, the first color film pattern 1140a has a boundary at least partially similar to a boundary of the light-transmitting opening 1131 adjacent to the first color film pattern 1140a. Therefore, the first color film pattern 1140a can better extend to the light-transmitting opening 1131 adjacent to the first color film pattern 1140a, thereby increasing the area of the first color film pattern 1140a to the greatest extent.

In some examples, as illustrated by FIGS. 1A and 2, the boundary of the second color film pattern 1140b is different from the boundary of the light-transmitting opening 1131 adjacent to the second color film pattern 1140b. Therefore, the area of the first color film pattern 1140a can be increased to a greater extent between the second color film pattern 1140b and the light-transmitting opening 1131 adjacent to each other.

For example, the boundary of the third color film pattern 1140c is different from the boundary of the light-transmitting opening 1131 adjacent to the third color film pattern 1140c. Therefore, the area of the first color film pattern 1140a can be increased to a greater extent between the third color film pattern 1140c and the light-transmitting opening 1131 adjacent to each other.

Figure 3:
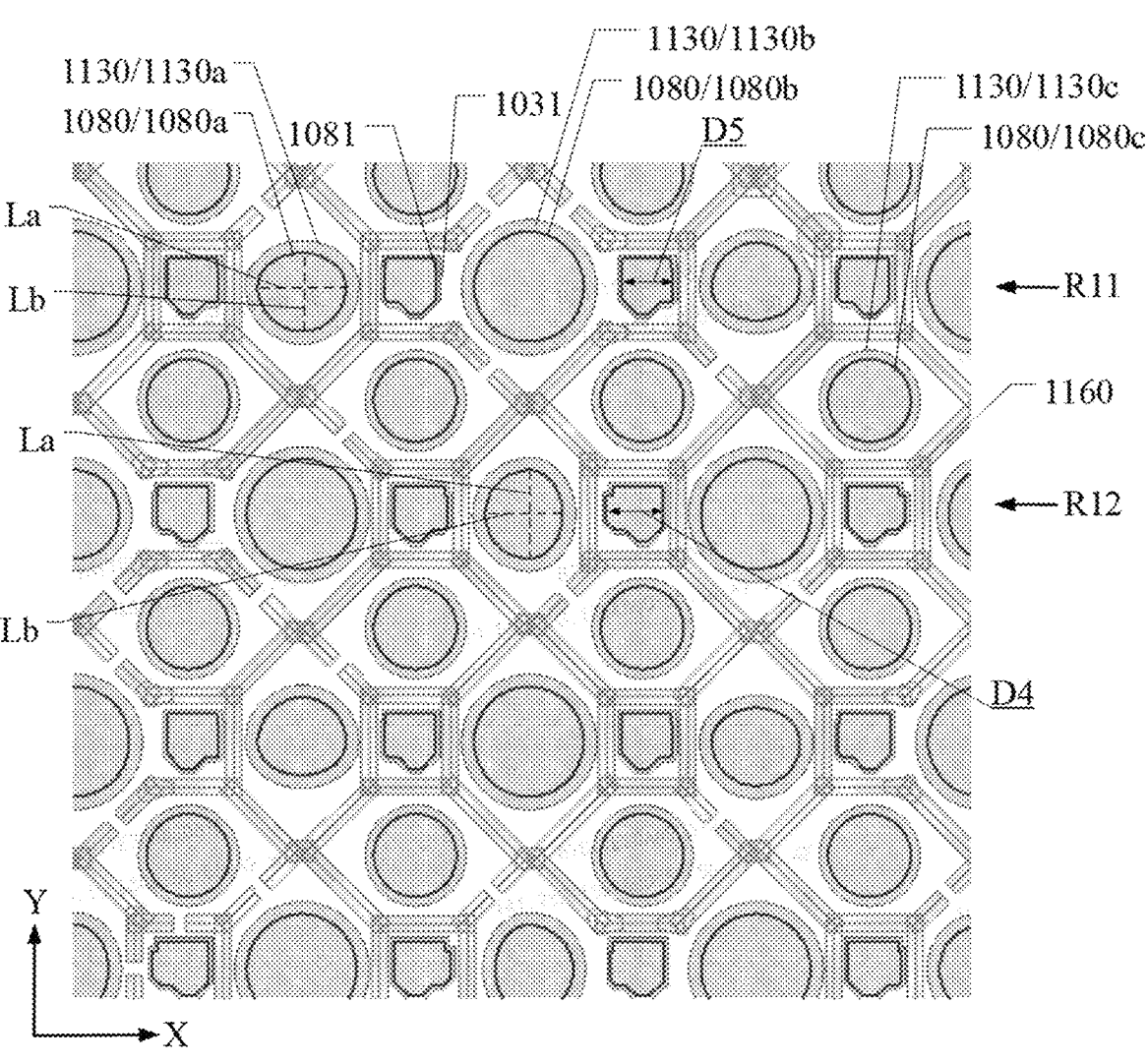
FIG. 3 is a schematic plan view of a laminating layer of a pixel defining layer, a touch layer and a black matrix layer in a display panel provided by at least one embodiment of the present disclosure.

FIG. 3 is a schematic plan view of a laminating layer of a pixel defining layer, a touch layer and a black matrix layer in a display panel provided by at least one embodiment of the present disclosure. As illustrated by FIG. 1B and FIG. 3, the display panel further includes a planarization layer 109 arranged on a side of the driving circuit layer 102 away from the base substrate 101 and a pixel defining layer 108 arranged on a side of the planarization layer 109 away from the base substrate 101. The pixel defining layer 108 includes a plurality of sub-pixel openings 1080 and a plurality of photosensitive openings 1081, and the light-emitting device EM includes a first electrode layer 104, a luminescent material layer 105 and a second electrode layer 106 which are sequentially laminated in a direction away from the base substrate 101. The first electrode layer 104 is arranged on a side of the planarization layer 109 away from the base substrate 101. The pixel defining layer 108 is arranged on a side of the first electrode layer 104 away from the base substrate 101, and the plurality of sub-pixel openings 1080 respectively expose the first electrode layers 104 of the light-emitting devices EM of the plurality of sub-pixels, and the plurality of sub-pixel openings 1080 define the light-emitting regions of the plurality of sub-pixels.

As illustrated by FIGS. 1B and 3, for one sub-pixel opening 1080 and one avoidance opening 1130 both corresponding to one same sub-pixel, an orthographic projection of the sub-pixel opening 1080 on the base substrate 101 is located inside an orthographic projection of the avoidance opening 1130 on the base substrate 101. For one photosensitive opening 1081 and one light-transmitting opening 1131 corresponding to one same light-transmitting region 1029, an orthographic projection of the photosensitive opening 1081 on the base substrate 101 is located inside an orthographic projection of the light-transmitting opening 1131 on the base substrate 101. Of course, the embodiment of the present disclosure is not limited thereto. For example, the orthographic projection of the photosensitive opening 1081 on the base substrate 101 may also be located outside the orthographic projection of the light-transmitting opening 1131 on the base substrate 101 or both may overlap.

In some examples, as illustrated by FIG. 3, a minimum distance between the boundary of the orthographic projection of the photosensitive opening 1081 on the base substrate 101 and the boundary of the orthographic projection of the light-transmitting opening 1131 on the base substrate 101 is greater than or equal to 1 μm. For example, the distance between them can be 1 μm, 1.1 μm, 1.2 μm, 1.3 μm, 1.5 μm. 1.6 μm. 1.8 μm or 2 μm, etc.

For example, the pixel defining layer 108 can be made of black light-absorbing material, which is beneficial to absorb the external natural light, thus reducing the reflectivity.

In some examples, as illustrated by FIG. 3, for one sub-pixel opening 1080 and one avoidance opening 1130 corresponding to one same sub-pixel, a shape of the sub-pixel opening 1080 is substantially the same as a shape of the avoidance opening 1130. For example, the shape may be generally circular or elliptical. For example, at least a part of the boundary of the sub-pixel opening 1080 and at least a part of the boundary of the avoidance opening 1130 are substantially parallel to each other.

In some examples, as illustrated by FIG. 3, for one photosensitive opening 1081 and one light-transmitting opening 1131 corresponding to one same light-transmitting region 1029, a shape of the photosensitive opening 1081 is approximately the same as a shape of the light-transmitting opening 1131. For example, at least a part of the boundary of the photosensitive opening 1081 and at least a part of the boundary of the light-transmitting opening 1131 are approximately parallel to each other.

In some examples, as illustrated by FIG. 3, the plurality of sub-pixel openings 1080 include a plurality of first color sub-pixel openings 1080a corresponding to the plurality of first color sub-pixels, a plurality of second color sub-pixel openings 1080b corresponding to the plurality of second color sub-pixels, and a plurality of third color sub-pixel openings 1080c corresponding to the plurality of third color sub-pixels.

In some examples, as illustrated by FIG. 3, an opening area of the second color sub-pixel opening 1080b is larger than an opening area of the first color sub-pixel opening 1080a.

In some examples, as illustrated by FIG. 3, orthographic projections of the second color sub-pixel opening 1080b and the third color sub-pixel opening 1080c on the base substrate 101 are substantially circular.

In some examples, as illustrated by FIG. 3, an orthographic projection of the first color sub-pixel opening 1080a on the base substrate 101 is substantially elliptical. For example, the orthographic projection of the first color sub-pixel opening 1080a on the base substrate 101 may be a non-standard ellipse. For example, the first color sub-pixel opening 1080a includes an ellipse long axis La and an ellipse short axis Lb, the ellipse long axis La is a longest line segment that can be obtained by connecting two points on the first color sub-pixel opening 1080a, and the ellipse short axis is a vertical bisecting line segment of the ellipse long axis La. For example, areas of the first color sub-pixel opening 1080a at both sides of the ellipse long axis La are not equal, and the first color sub-pixel opening 1080a is not symmetrical about the ellipse long axis La. For example, areas of the first color sub-pixel opening 1080a at both sides of the ellipse short axis Lb are approximately equal, and the first color sub-pixel opening 1080a is approximately symmetrical about the ellipse short axis Lb.

In some examples, as illustrated by FIG. 3, the first sub-pixel row includes a first type of first sub-pixel row R11, and the ellipse long axis La of the first color sub-pixel opening 1080a in the first type of first sub-pixel row R11 extends substantially along the first direction X. In the first type of first sub-pixel row R11, two photosensitive openings 1081 both adjacent to the first color sub-pixel opening 1080a are symmetrical about a straight line where the ellipse short axis Lb of the first color sub-pixel opening 1080a is located, and two photosensitive openings 1081 both adjacent to the second color sub-pixel opening 1080b are symmetrical about a straight line along the second direction Y and passing through a center of the second color sub-pixel opening 1080b.

In some examples, as illustrated by FIG. 3, in the first type of first sub-pixel row R11, two photosensitive openings 1081 both adjacent to the first color sub-pixel opening 1080a form a first photosensitive opening group, which is arranged along the first direction X.

In some examples, as illustrated by FIG. 3, the first sub-pixel row includes a second type of first sub-pixel row R12, and the ellipse long axis La of the first color sub-pixel opening 1080a in the second type of first sub-pixel row R12 extends substantially along the second direction Y. In the second type of first sub-pixel row R12, two photosensitive openings 1081 both adjacent to the second color sub-pixel opening 1080b are symmetrical about a straight line along the second direction Y and passing through a center of the second color sub-pixel opening 1080b.

In some examples, as illustrated by FIG. 3, in the second type of first sub-pixel row R12, two photosensitive openings 1081 both adjacent to the second color sub-pixel opening 1080b with space therebetween are symmetrical about a straight line along the second direction Y and passing through the center of the second color sub-pixel opening 1080b.

In some examples, as illustrated by FIG. 3, a maximum dimension D4 of the photosensitive opening 1081 between sub-pixels in the second type of first sub-pixel row R12 in the first direction X is greater than a maximum dimension D5 of the photosensitive opening 1081 between sub-pixels in the first type of first sub-pixel row R11 in the first direction X.

In some examples, as illustrated by FIG. 3, the first type of first sub-pixel row R11 and the second type of first sub-pixel row R12 are alternately arranged in the second direction Y.

Figure 4:
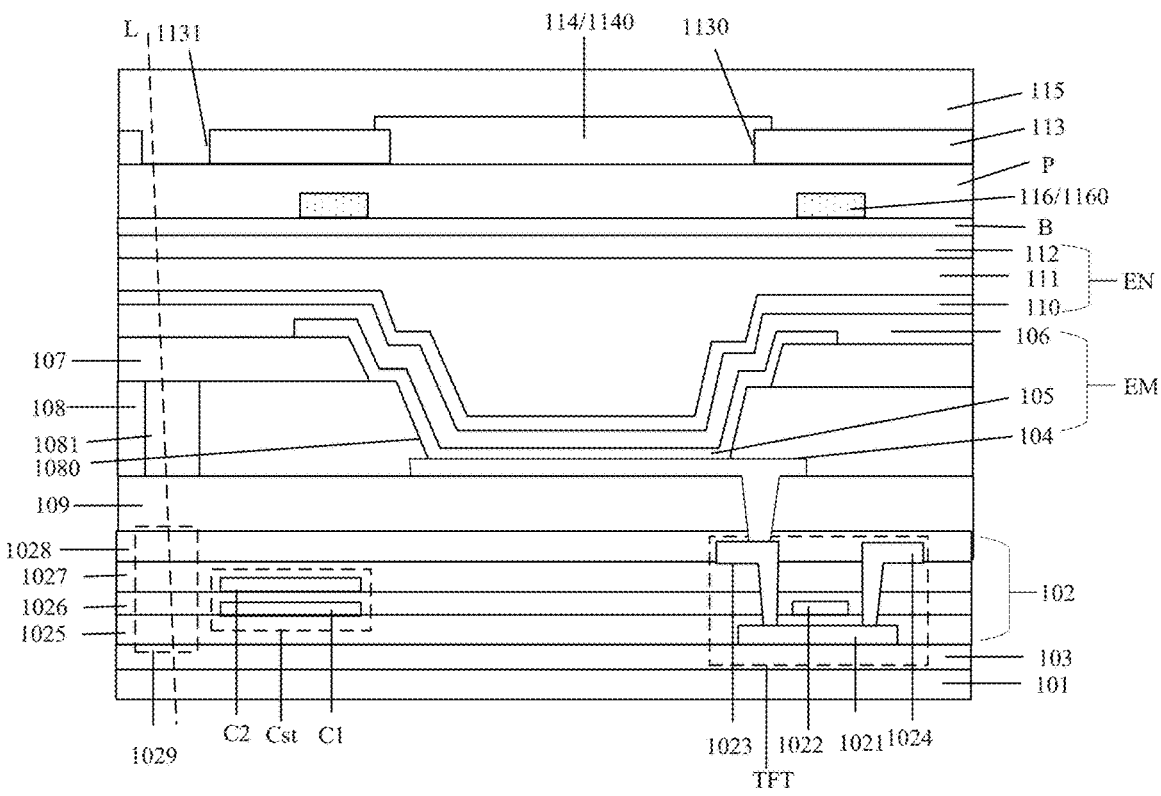
FIG. 4 is another schematic cross-sectional view of a display panel provided by at least one embodiment of the present disclosure.

FIG. 4 is another schematic cross-sectional view of a display panel provided by at least one embodiment of the present disclosure. As illustrated by FIGS. 3 and 4, the display panel further includes a touch layer 116, which is arranged on a side of the pixel defining layer 108 away from the base substrate 101. The touch layer 116 includes a plurality of touch lines 1160, and orthographic projections of the plurality of touch lines 1160 on the base substrate 101 are staggered from the orthographic projections of the plurality of avoidance opening 1130 and the orthographic projections of the plurality of light-transmitting opening 1131 on the base substrate 101, and the plurality of touch lines 1160 are arranged crosswise to form a mesh structure. Therefore, exposure of the touch line 1160 can be avoided, and the reflectivity of the display panel to external light can be reduced, so that the display effect of the display panel is better.

For example, the touch layer 116 can be any type of touch structure such as a self-capacitance touch structure or a mutual capacitance touch structure. For example, both the self-capacitance touch structure and the mutual capacitance touch structure include at least one conductive layer. The embodiment of the present disclosure does not limit the specific type and structure of the touch layer 116.

For example, the touch layer 116 may be a metal layer or a transparent conductive layer, and its material may include metal materials such as copper and aluminum or transparent metal oxides such as ITO and IZO.

For example, as illustrated by FIG. 4, a side of the touch layer 116 close to the base substrate 101 may further include a substrate B. and the touch layer 116 is bonded to an encapsulation layer EN through the substrate B. For example, the substrate B may include inorganic insulating materials such as silicon oxide, silicon nitride or silicon oxynitride, or organic insulating materials such as polyimide.

For example, as illustrated by FIG. 4, the touch layer 116 may be covered with a protective insulating layer P, and the protective insulating layer P may also include inorganic insulating materials such as silicon oxide, silicon nitride or silicon oxynitride or organic insulating materials such as polyimide to protect the touch layer 116. The embodiment of the present disclosure does not specifically limit other structures and materials of the touch layer 116.

In some examples, as illustrated by FIG. 3, a minimum distance between a boundary of the orthographic projection of the touch line 1160 on the base substrate 101 and the boundary of the orthographic projection of the light-transmitting opening 1131 on the base substrate 101 is greater than or equal to 1.7 μm, and a minimum distance between the boundary of the orthographic projection of the touch line 1160 on the base substrate 101 and the boundary of the orthographic projection of the avoidance opening 1130 on the base substrate 101 is greater than or equal to 1.7 μm.

Figure 5:
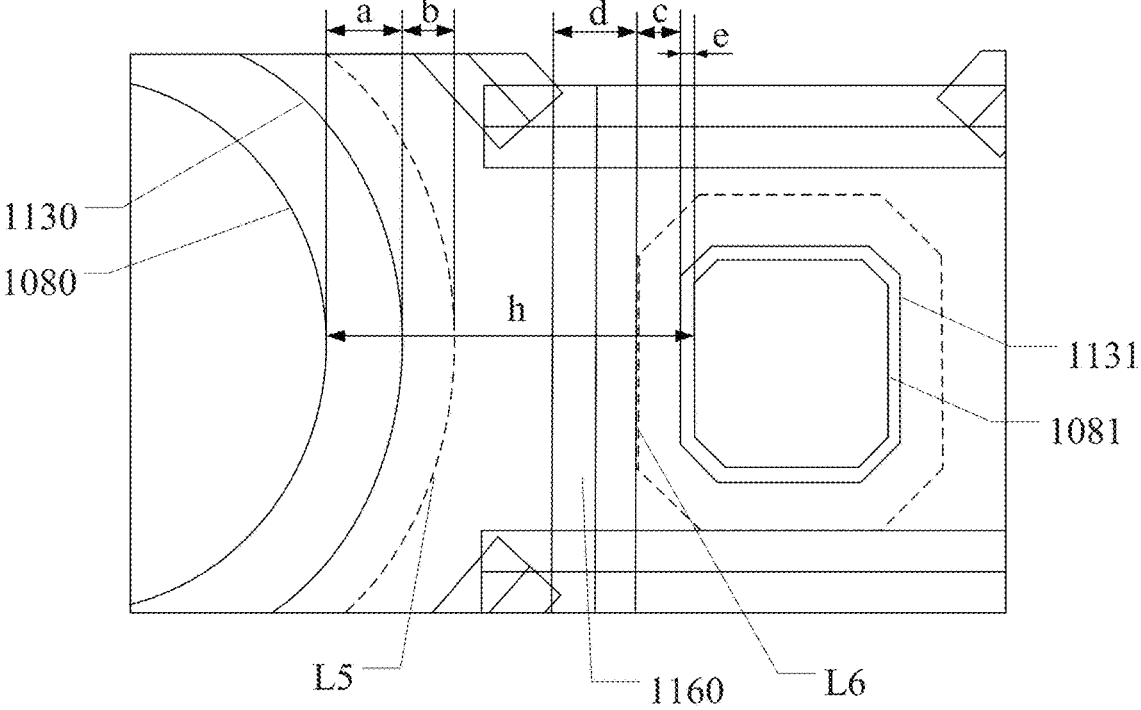
FIG. 5 is a partial plan view of a laminating layer of another pixel defining layer, a touch layer and a black matrix layer in a display panel provided by at least one embodiment of the present disclosure.

FIG. 5 is a partial plan view of a laminating layer of another pixel defining layer, a touch layer and a black matrix layer in a display panel provided by at least one embodiment of the present disclosure. As illustrated by FIGS. 4 and 5, in the direction perpendicular to the base substrate 101, a minimum distance between adjacent sub-pixel opening 1080 and photosensitive opening 1081 is h, and the touch line 1160 is provided between the adjacent sub-pixel opening 1080 and photosensitive opening 1081. A distance between the boundary of the avoidance opening 1130 corresponding to the sub-pixel opening 1080 and the boundary of the sub-pixel opening 1080 is a, and a minimum distance between the boundary of the avoidance opening 1130 and the touch line 1160 is b, so that a first boundary L5 defining the touch line 1160 can be obtained according to the boundary of the avoidance opening 1130 and the minimum distance b, and a minimum distance between the light-transmitting opening 1131 and the touch line 1160 is c. Therefore, a second boundary L6 defining the touch trace 1160 can be obtained according to the light-transmitting opening 1131 and the minimum distance c, and further, the touch trace 1160 between the adjacent sub-pixel opening 1080 and the photosensitive opening 1081 is defined in an area between the first boundary L5 and the second boundary L6 in the diagram. For example, the minimum distance b and the minimum distance c may be equal. A dimension of the touch line 1160 is d, and a distance between the boundary of the light-transmitting opening 1131 corresponding to the photosensitive opening 1081 and the boundary of the photosensitive opening 1081 is e, a minimum distance between the adjacent sub-pixel opening 1080 and the photosensitive opening 1081 is h, h=a+b+c+d+e.

For example, by reducing the distance a, areas of the light-transmitting opening 1131 and the photosensitive opening 1081 can be increased, so that the photosensitive sensitivity of the photosensitive device can be improved. For example, a minimum line width of the black matrix layer 113 between the adjacent sub-pixel opening 1080 and photosensitive opening 1081 can be decreased, the process of the black matrix layer 113 can be improved, so that the areas of the light-transmitting opening 1131 and photosensitive opening 1081 can also be increased, so that the photosensitive sensitivity of the photosensitive device can be improved.

In some examples, as illustrated by FIGS. 1B and 4, the display panel may further include a spacer 107 arranged on the pixel defining layer 108 and an encapsulation layer EN arranged on the light-emitting device EM of the sub-pixel. For example, the spacer 107 can be made of black light-absorbing material, which is beneficial to absorb the external natural light, thus reducing; the reflectivity. For example, the encapsulation layer EN may include multiple packaging sub-layers to improve its encapsulation effect. For example, the encapsulation layer EN may be a composite encapsulation layer, including a first inorganic encapsulation layer 110, a second organic encapsulation layer 111 and a third inorganic encapsulation layer 112. For example, the first inorganic encapsulation layer 110 and the third inorganic encapsulation layer 112 may be formed of inorganic materials such as silicon nitride, silicon oxide and silicon oxynitride, and the second organic encapsulation layer 111 may be formed of organic materials such as PI (polyimide) and epoxy resin. The composite packaging layer can form multiple protections for the functional structure on the display panel, and has better packaging effect.

Hereinafter, a structure and circuit arrangement of each functional layer of the display panel provided by the embodiment of the present disclosure will be introduced in detail through a specific example. In this example, the sub-pixel drives the light-emitting device EM by using a 7T1C pixel driving circuit.

Figure 6A:
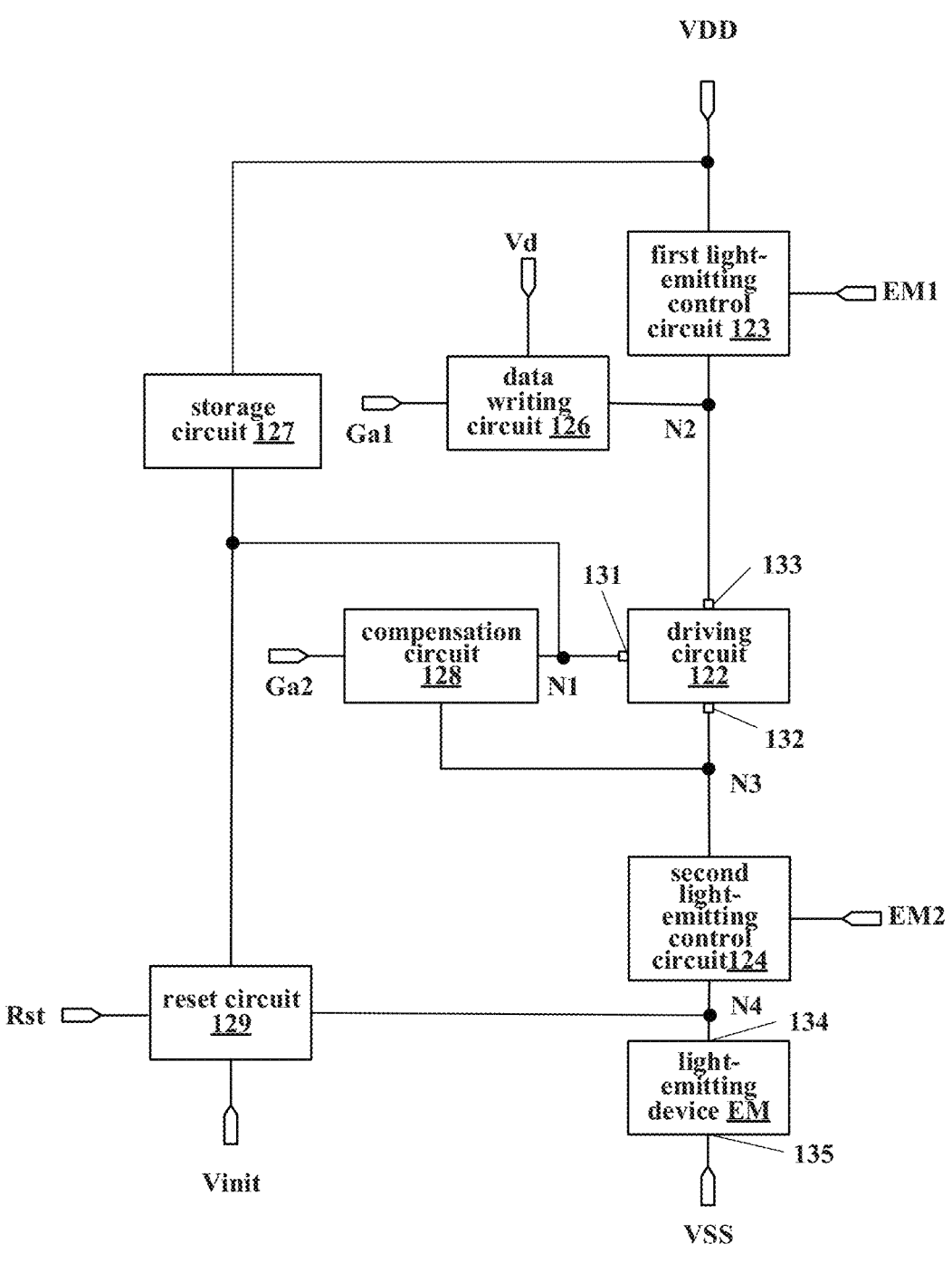
FIG. 6A is a schematic diagram of a pixel driving circuit of a display panel provided by at least one embodiment of the present disclosure.

For example, FIG. 6A illustrates a circuit diagram of a 7T1C pixel circuit. As illustrated by FIG. 6A, the pixel circuit includes a driving circuit 122, a data writing circuit 126, a compensation circuit 128, a storage circuit 127, a first light-emitting control circuit 123, a second light-emitting control circuit 124 and a reset circuit 129.

For example, the driving circuit 122 includes a control terminal 131, a first terminal 132 and a second terminal 133, which is configured to control a driving current flowing through the light-emitting device EM, and the control terminal 131 of the driving circuit 122 is connected to a first node N1, the first terminal 132 of the driving circuit 122 is connected to a second node N2, and the second terminal 133 of the driving circuit 122 is connected to a third node N3.

For example, the data writing circuit 126 includes a control terminal, a first terminal and a second terminal, the control terminal is configured to receive a first scanning signal Ga1, the first terminal is configured to receive a data signal Vd, and the second terminal is connected to the first terminal 132 (second node N2) of the driving circuit 122 and configured to write the data signal Vd to the first terminal 132 of the driving circuit 122 in response to the first scanning signal Ga1.

For example, in a data writing stage, the data writing circuit 126 can be turned on in response to the first scanning signal Ga1, so that the data signal Vd can be written into the first terminal 132 (second node N2) of the driving circuit 122 and stored in the storage circuit 127, so that a driving current for driving the light-emitting device EM to emit light can be generated according to the data signal in a light-emitting stage, for example.

For example, the compensation circuit 128 includes a control terminal, a first terminal and a second terminal, the control terminal is configured to receive a second scanning signal Ga2, and the first and second terminals are electrically connected with the control terminal 131 and the second terminal 133 of the driving circuit 122, respectively, and the compensation circuit 128 is configured to perform threshold compensation on the driving circuit 120 in response to the second scanning signal Ga2.

For example, the storage circuit 127 is electrically connected to the control terminal 131 of the driving circuit 122 and a first voltage terminal VDD and configured to store the data signal Vd written by the data writing circuit 126. For example, in a data writing and compensation stage, the compensation circuit 128 can be turned on in response to the second scanning signal Ga2, so that the data signal written by the data writing circuit 126 can be stored in the storage circuit 127. For example, at the same time in the data writing and compensation stage, the compensation circuit 128 can electrically connect the control terminal 131 and the second terminal 133 of the driving circuit 122, so that the relevant information of the threshold voltage of the driving circuit 122 can be stored in the storage circuit 127 accordingly, so that the stored data signal and the threshold voltage can be used to control the driving circuit 122 in the light-emitting stage, for example, so that the output of the driving circuit 122 can be compensated.

For example, the first light-emitting control circuit 123 is connected to the first terminal 132 (second node N2) of the driving circuit 122 and the first voltage terminal VDD, and is configured to apply a first power supply voltage of the first voltage terminal VDD to the first terminal 132 of the driving circuit 122 in response to a first light-emitting control signal. For example, as illustrated by FIG. 6A, the first light-emitting control circuit 123 is connected to the first light-emitting control terminal EM1, the first voltage terminal VDD and the second node N2.

For example, the second light-emitting control circuit 124 is connected to a second light-emitting control terminal EM2, a first terminal 510 of the light-emitting device EM, and the second terminal 132 of the driving circuit 122, and is configured such that a driving current can be applied to the light-emitting device EM in response to a second light-emitting control signal.

For example, in a light-emitting stage, the second light-emitting control circuit 123 is turned on in response to the second light-emitting control signal provided by the second light-emitting control terminal EM2, so that the driving circuit 122 can apply the driving current to the light-emitting device EM through the second light-emitting control circuit 123 to make it emit light. In a non-light-emitting stage, the second light-emitting control circuit 123 is turned off in response to the second light-emitting control signal, so that the current flowing through the light-emitting device EM is avoided to make it emit light and the contrast of the corresponding display device can be improved.

For another example, in an initialization stage, the second light-emitting control circuit 124 can also be turned on in response to the second light-emitting control signal, so that the reset circuit 129 can be combined to reset the driving circuit 122 and the light-emitting device EM.

For example, the second light-emitting control signal EM2 may be the same as or different from the first light-emitting control signal EM1, for example, they may be connected to the same or different signal output terminals.

For example, the reset circuit 129 is connected to a reset voltage terminal Vinit and the first terminal 134 (fourth node N4) of the light-emitting device EM, and is configured to apply a reset voltage to the first terminal 134 of the light-emitting device EM in response to a reset signal. In other examples, as illustrated by FIG. 6A, the reset signal can also be applied to the control terminal 131 of the driving circuit, that is to say, the first node N1. For example, the reset signal is the second scanning signal, and the reset signal can also be other signals synchronized with the second scanning signal, which is not limited by the embodiment of the present disclosure. For example, as illustrated by FIG. 6A, the reset circuit 129 is connected to the first terminal 134 of the light-emitting device EM, the reset voltage terminal Vinit and a reset control terminal Rst (reset control line) respectively. For example, in an initialization stage, the reset circuit 129 can be turned on in response to the reset signal, so that the reset voltage can be applied to the first terminal 134 and the first node N1 of the light-emitting device EM, so that the drive circuit 122, the compensation circuit 128 and the light-emitting device EM can be reset, and the influence of the previous light-emitting stage can be eliminated.

For example, the light-emitting device EM includes a first terminal 134 and a second terminal 135, the first terminal 134 is configured to receive the driving current from the second terminal 133 of the driving circuit 122 and a second terminal 135 is configured to be connected to a second voltage terminal VSS. For example, as illustrated by FIG. 6A, the first terminal 134 of the light-emitting device EM may be connected to the third node N3 through the second light-emitting circuit 124. Embodiments of the present disclosure include but are not limited thereto. For example, the light-emitting device EM can be various types of OLEDs, such as top emission, bottom emission, double-sided emission, etc., and can emit red light, green light, blue light or white light, etc. The first electrode layer and the second electrode layer of the OLED are respectively used as the first terminal 134 and the second terminal 135 of the light-emitting device. The embodiment of the present disclosure does not limit the specific structure of the light-emitting device.

It should be noted that in the description of the embodiment of the present disclosure, the first node N1, the second node N2, the third node N3 and the fourth node N4 do not necessarily represent the actual components, but represent the meeting points of related circuit connections in the circuit diagram.

It should be noted that in the description of the embodiment of the present disclosure, the symbol Vd can indicate both the data signal terminal and a level of the data signal, similarly, the symbols Ga1 and Ga2 can indicate not only the first scanning signal and the second scanning signal, but also the first scanning signal terminal and the second scanning signal terminal, the symbol Rst can indicate both the reset control terminal and the reset signal, and the symbol Vinit can indicate both the reset voltage terminal and the reset voltage. The symbol VDD can indicate both the first voltage terminal and the first power supply voltage, and the symbol VSS can indicate both the second voltage terminal and the second power supply voltage. The following embodiments are the same as this and will not be described in detail.

Figure 6B:
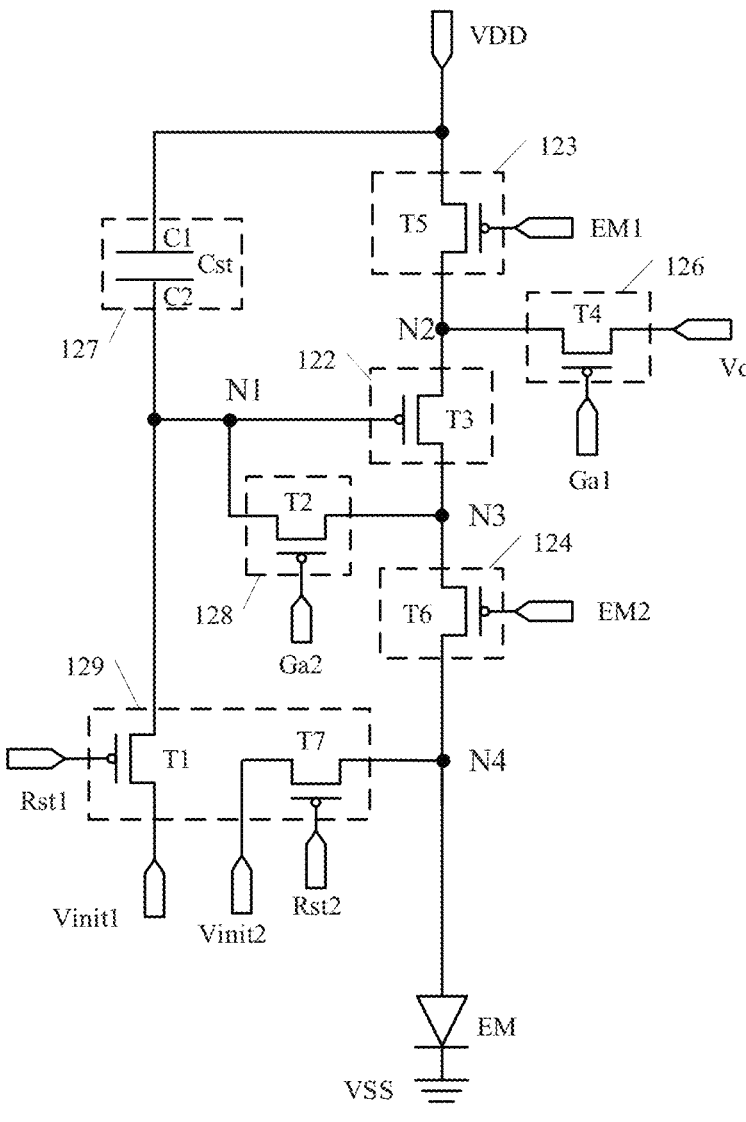
FIG. 6B is a schematic diagram of another pixel driving circuit of the display panel provided by at least one embodiment of the present disclosure.

FIG. 6B is a circuit diagram of a specific implementation example of the pixel circuit illustrated by FIG. 6A. As illustrated by FIG. 6B, the pixel circuit includes first transistor to seventh transistor T1, T2, T3, T4, T5, T6, T7 and a storage capacitor Cst. For example, the third transistor T3 is used as a driving transistor, and other transistors are used as switching transistors.

For example, as illustrated by FIG. 6B the driving circuit 122 may be implemented as the third transistor T3. A gate electrode of the third transistor T3 serves as the control terminal 131 of the driving circuit 122 and is connected to the first node N1. A first electrode of the third transistor T3 serves as the first end 132 of the driving circuit 122 and is connected to the second node N2. A second electrode of the third transistor T3 serves as the second terminal 133 of the driving circuit 122 and is connected to the third node N3.

For example, as illustrated by FIG. 6B, the data writing circuit 126 may be implemented as the fourth transistor T4. A gate electrode of the fourth transistor T4 is connected to the first scanning signal line (first scanning signal terminal Ga1) to receive the first scanning signal, a first electrode of the fourth transistor T4 is connected to the data line (data signal terminal Vd) to receive the data signal, and a second electrode of the fourth transistor T4 is connected to the first terminal 132 (second node N2) of the driving circuit 122. For example, the fourth transistor T4 is a P-type transistor, such as a thin film transistor whose active layer is low-temperature doped polysilicon.

For example, as illustrated by FIG. 6B the compensation circuit 128 may be implemented as the second transistor T2. A gate electrode of the second transistor T2 is configured to be connected with the second scanning signal line (second scanning signal terminal Ga2) to receive the second scanning signal, a first electrode of the second transistor T2 is connected with the control terminal 131 (first node N1) of the driving circuit 122, and a second electrode of the second transistor T2 is connected with the second terminal 133 (third node N3) of the driving circuit 122.

For example, as illustrated by FIG. 6B, the storage circuit 127 can be realized as the storage capacitor Cst, the storage capacitor Cst includes the first capacitor electrode C1 connected to the first voltage terminal VDD and the second capacitor electrode C2 connected to the control terminal 131 of the driving circuit 122.

For example, as illustrated by FIG. 6B, the first light-emitting control circuit 123 may be implemented as the fifth transistor T5. A gate electrode of the fifth transistor T5 is connected to the first light-emitting control line (first light-emitting control terminal EM1) to receive the first light-emitting control signal, a first electrode of the fifth transistor T5 is connected to the first voltage terminal VDD to receive the first power supply voltage, and a second electrode of the fifth transistor T5 is connected to the first terminal 132 (second node N2) of the driving circuit 122.

For example, the light-emitting device EM can be embodied as a light-emitting diode (LED), and its first electrode layer (here is the anode) is configured to be connected to the fourth node N4 and receive the driving current from the second terminal 133 of the driving circuit 122 through the second light-emitting control circuit 124, and its second electrode layer (here is the cathode) is configured to be connected to the second voltage terminal VSS and receive the second power supply voltage. For example, the second voltage terminal can be grounded, that is to say, VSS can be 0 V.

For example, the second light-emitting control circuit 124 may be implemented as the sixth transistor T6. A gate electrode of the sixth transistor T6 is connected to the second light-emitting control line (second light-emitting control terminal EM2) to receive the second light-emitting control signal, a first electrode of the sixth transistor T6 is connected to the second terminal 133 (third node N3) of the driving circuit 122, and a second electrode of the sixth transistor T6 is connected to the first terminal 134 (fourth node N4) of the light-emitting device EM.

For example, the reset circuit 129 may include a first reset circuit and a second reset circuit, the first reset circuit is configured to apply a first reset voltage Vinit1 to the first node N1 in response to the first reset signal Rst1, the second reset circuit is configured to apply a second reset voltage Vinit2 to the fourth node N4 in response to the second reset signal Rst2. For example, as illustrated by FIG. 6B, the first reset circuit is implemented as the sixth transistor T6, and the second reset circuit is implemented as the seventh transistor T7. A gate electrode of the sixth transistor T6 is configured to be connected with the first reset control terminal Rst1 to receive the first reset signal Rst1, a first electrode of the sixth transistor T6 is connected with the first reset voltage terminal Vinit1 to receive the first reset voltage Vinit1, and a second electrode of the sixth transistor T6 is configured to be connected with the first node N1. A gate electrode of the seventh transistor T7 is configured to be connected with the second reset control terminal Rst2 to receive the second reset signal Rst2, a first electrode of the seventh transistor T7 is connected with the second reset voltage terminal Vinit2 to receive the second reset voltage Vinit2, and a second electrode of the seventh transistor T7 is configured to be connected with the fourth node N4.

It should be noted that the transistors used in the embodiments of this present disclosure can all be thin film transistors, field effect transistors or other switching devices with the same characteristics, and the embodiments of this present disclosure all take thin film transistors as examples to explain. The source electrode and drain electrode of the transistor used here can be symmetrical in structure, so there can be no difference in structure between the source electrode and drain electrode. In the embodiment of the present disclosure, in order to distinguish the two electrodes of the transistor except the gate electrode, one of them is directly described as the first electrode and the other as the second electrode.

The layout design of the above pixel driving circuit is described in detail below.

Figure 7:
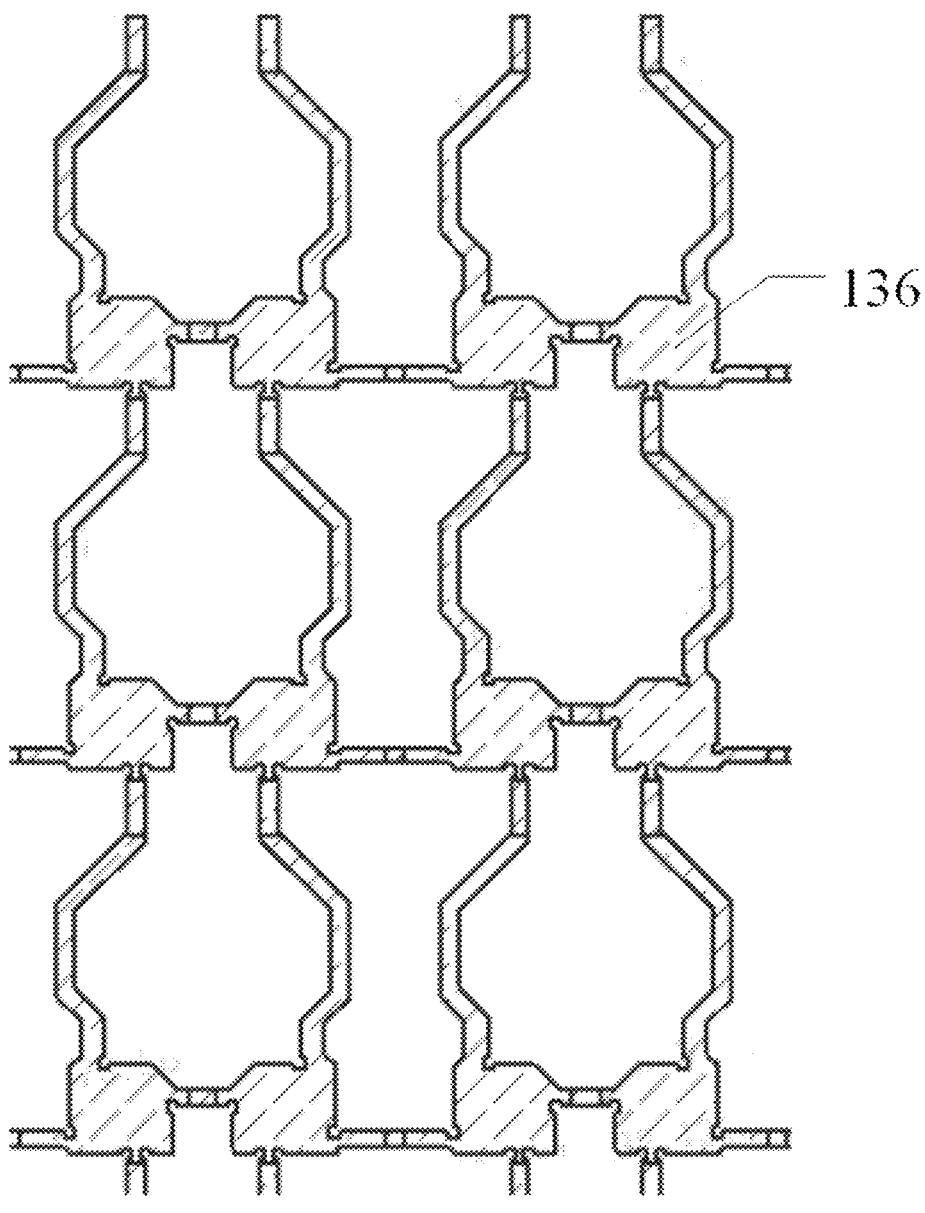
FIGS. 7-14 are partial schematic plan views of some functional layers of a display panel and partial schematic plan views of some functional layers laminated in sequence according to at least one embodiment of the present disclosure.

For example, FIG. 7 shows a schematic diagram of a shielding layer of the display panel. A shielding layer 136 is arranged between the base substrate and the thin film transistor, which can reduce the bad influence of the base substrate on the thin film transistor. For example, a material of the shielding layer 136 includes metal.

Figure 8:
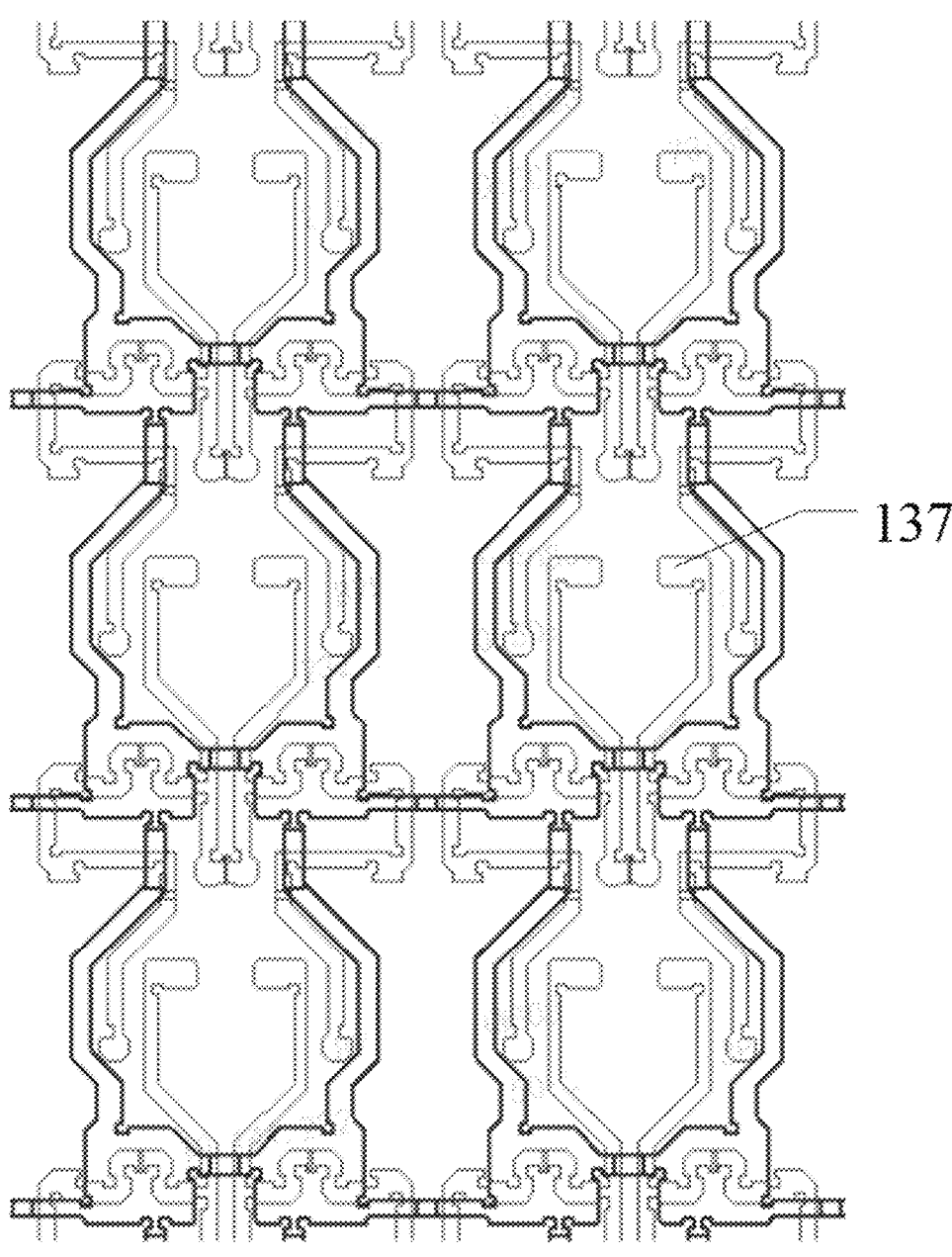

For example, FIG. 8 shows a schematic diagram of the shielding layer and a first semiconductor laminated layer of the display panel. A first semiconductor layer 137 can be used to form the active layers of thin film transistors of the plurality of pixel driving circuits of the plurality of sub-pixels.

For example, a first gate insulating layer is further provided on the first semiconductor layer 137, which is not illustrated by the diagram.

Figure 9:
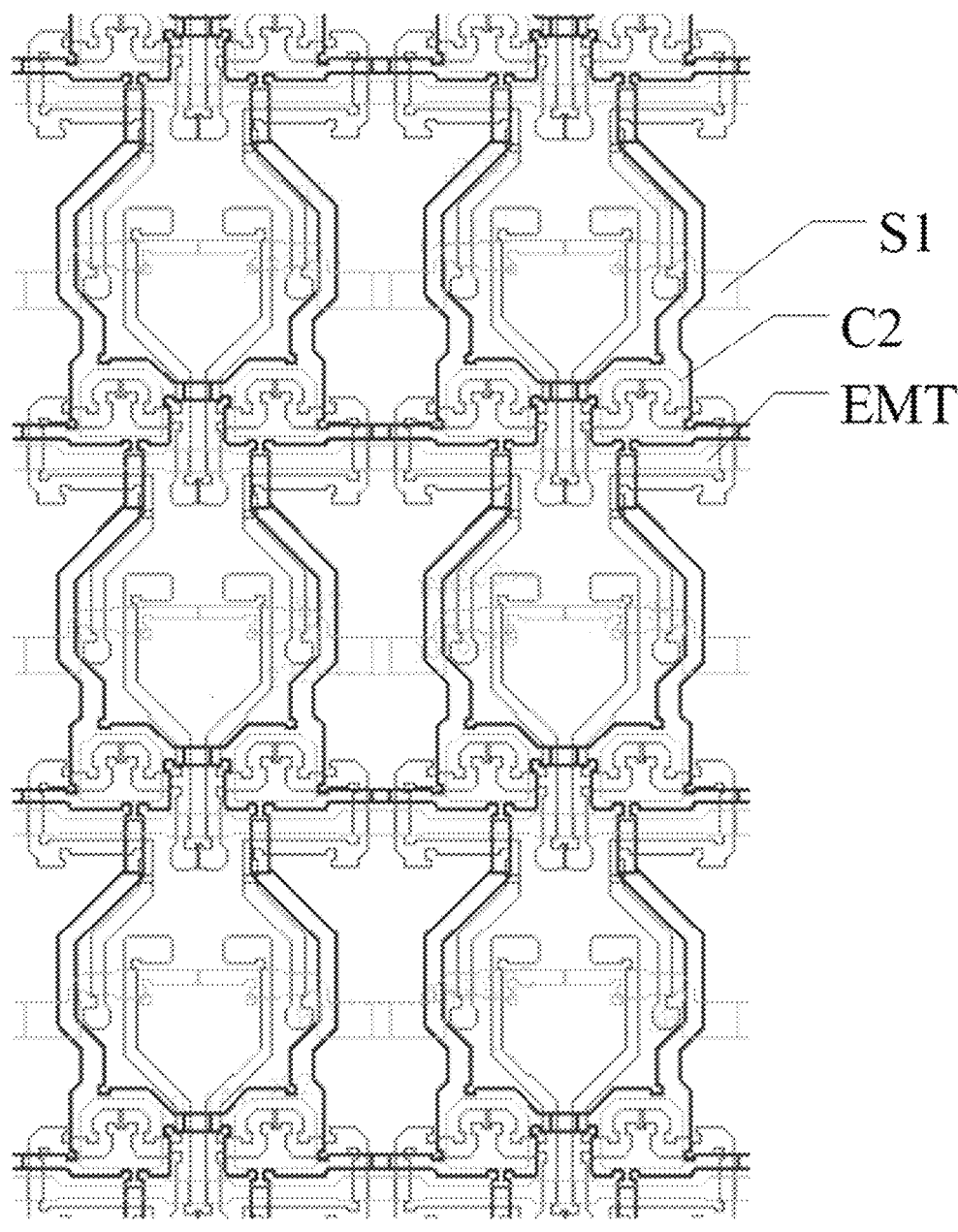

For example, FIG. 9 shows a schematic diagram of a laminating layer of the shielding layer, the semiconductor layer and a first gate metal layer of the display panel. A first gate metal layer is arranged on the first gate insulating layer.

For example, as illustrated by FIG. 9, the first gate metal layer includes a plurality of first scanning signal lines S1, a plurality of light-emitting control lines EMT, and a plurality of second capacitor electrodes C2 of storage capacitors Cst. For example, overlapping portions of the plurality of first scanning signal lines S1 and active layers of the plurality of thin film transistors, overlapping portions of the plurality of light-emitting control lines EMIT and active layers of the plurality of thin film transistors both constitute gate electrodes of the plurality of thin film transistors.

For example, a second gate insulating layer is further provided on the first gate metal layer, which is not illustrated by the diagram.

Figure 10:
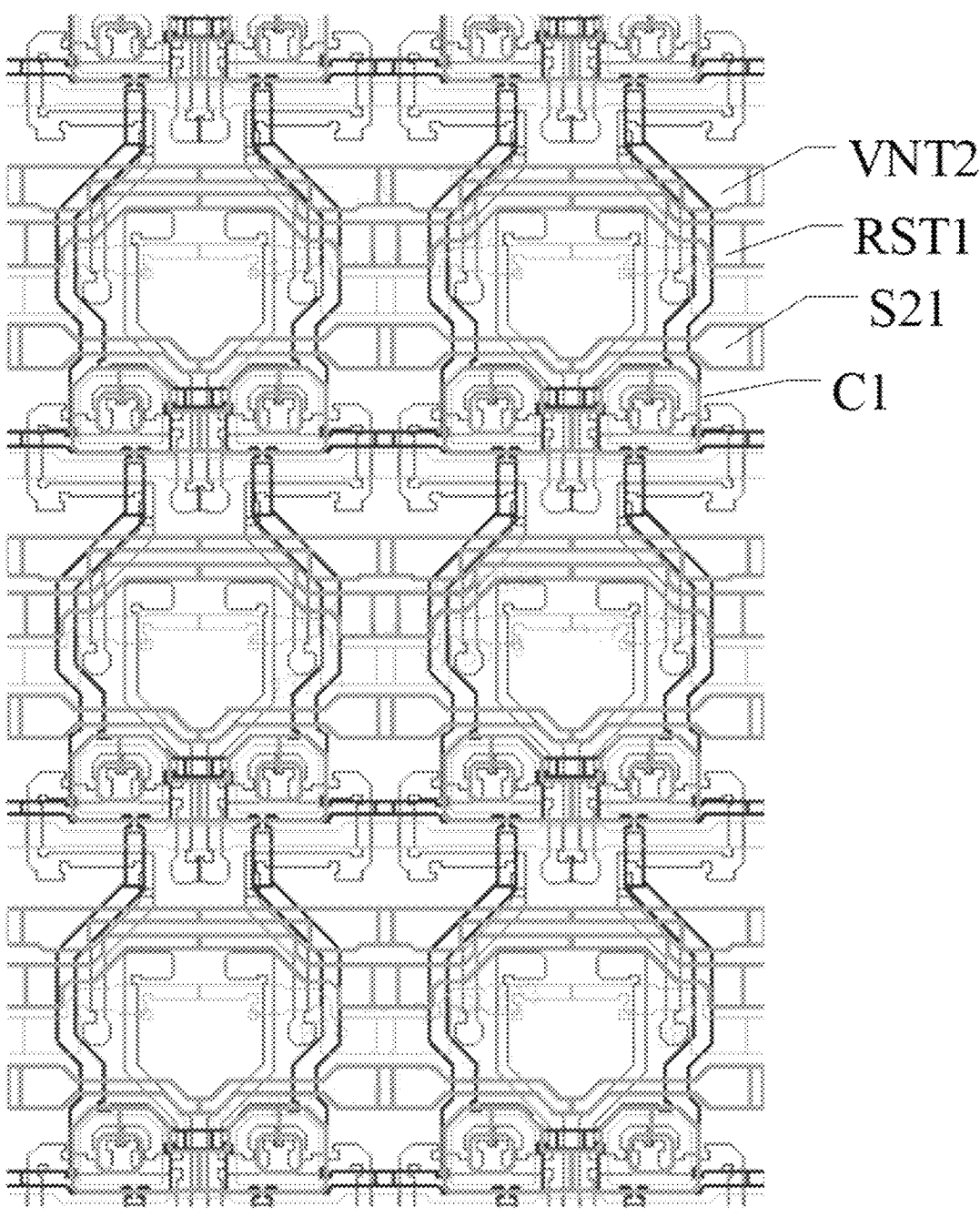

FIG. 10 shows a schematic diagram of a laminating layer of the shielding layer, the semiconductor layer, the first gate metal layer and a second gate metal layer of the display panel, and the second gate metal layer is arranged on the second gate insulating layer.

For example, as illustrated by FIG. 10, the second gate metal layer includes a plurality of first capacitor electrodes C1 of storage capacitors Cst and a plurality of reset voltage lines VNT2. For example, the second scanning signal line S2 may include a first sub-scanning signal line S21 and a second sub-scanning signal line S22, a plurality of first sub-scanning signal lines S21 may be located in the second gate metal layer. For example, the reset control line RST may include a first sub-reset control line RST1 and a second sub-reset control line RST2, a plurality of first sub-reset control lines RST1 may be located in the second gate metal layer. The first capacitor electrodes C1 and the second capacitor electrodes C2 of the plurality of storage capacitors Cst at least partially overlap to form capacitors.

For example, an interlayer insulating layer is further provided on the second gate metal layer, which is not illustrated by the diagram.

Figure 11:
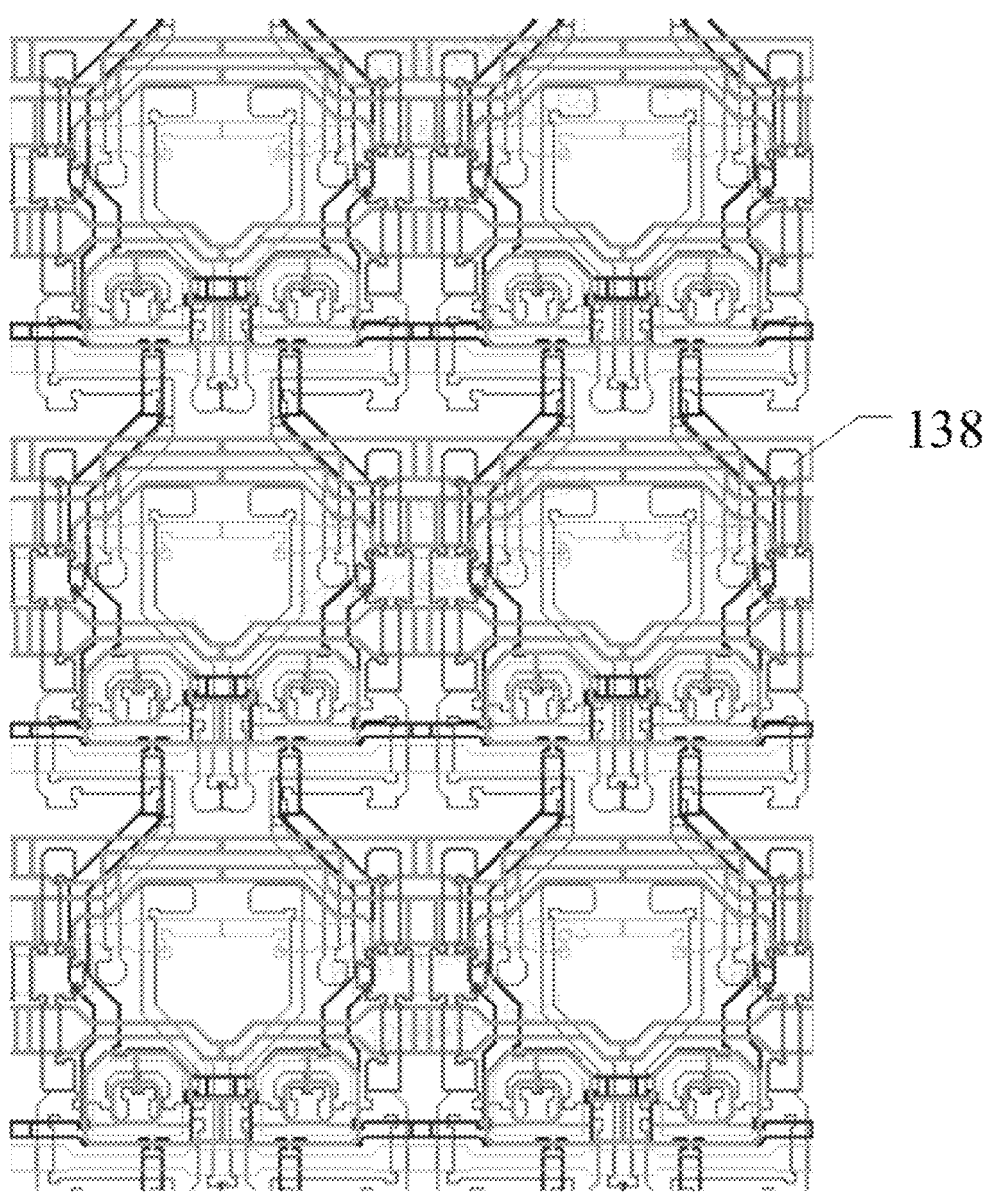

For example, FIG. 11 shows a schematic diagram of a laminating layer of the shielding layer, the semiconductor layer, the first gate metal layer, the second gate metal layer and a second semiconductor layer of the display panel. A second semiconductor layer 138 is used for forming active layers of the plurality of thin film transistors of pixel driving circuits of the plurality of sub-pixels.

For example, a third gate insulating layer is further provided on the second semiconductor layer, which is not illustrated by the diagram.

Figure 12:
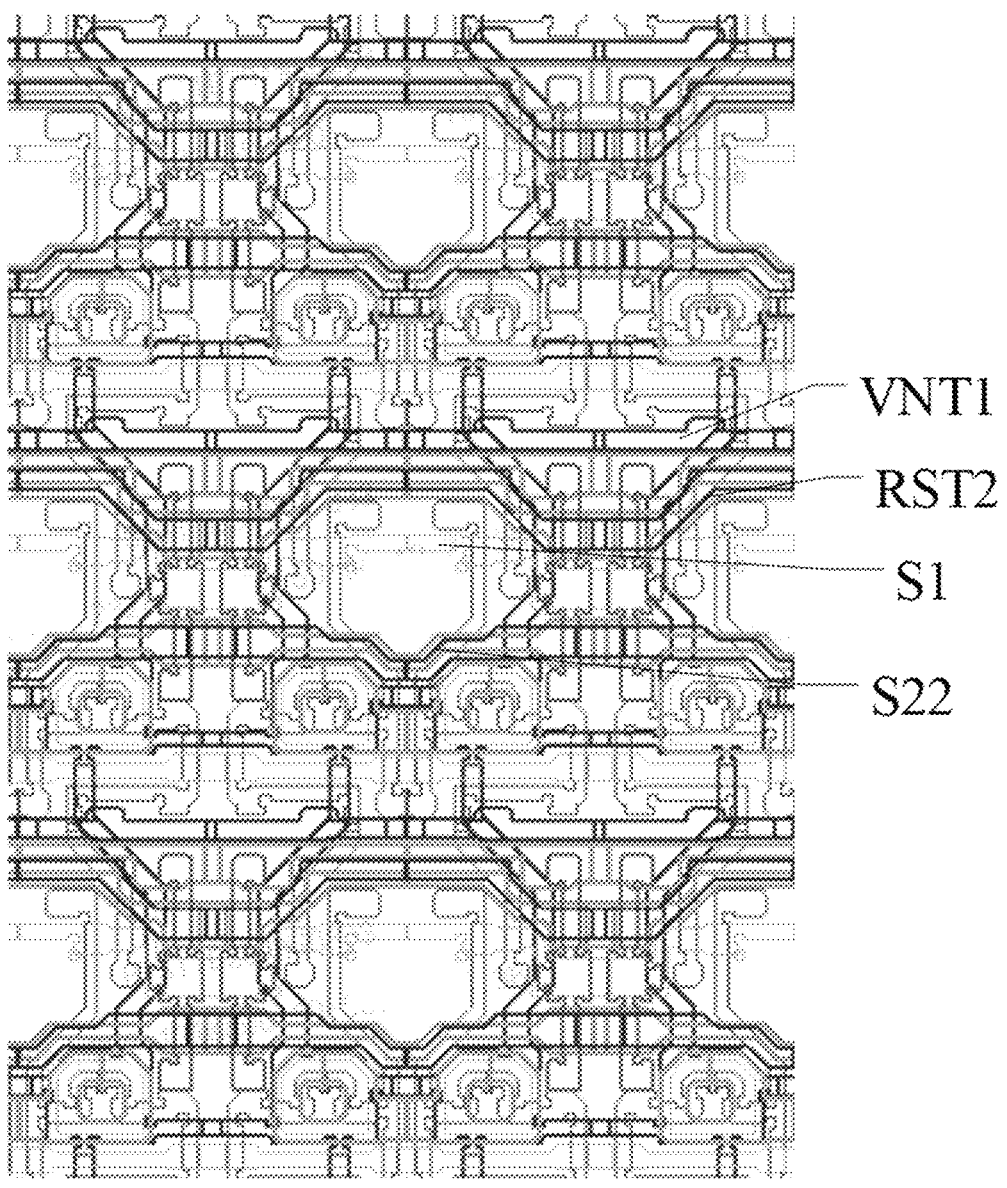

For example, FIG. 12 shows a schematic diagram of a laminating layer of the shielding layer, the semiconductor layer, the first gate metal layer, the second gate metal layer, the second semiconductor layer and a third gate metal layer of the display panel. A third gate metal layer is arranged on the third gate insulating layer.

For example, as illustrated by FIG. 12, the third gate metal layer includes a plurality of reset voltage lines VNT1, a plurality of second sub-reset control lines RST2 and a plurality of second sub-scanning signal lines S22.

For example, a plurality of interlayer insulating layers are further provided on the third gate metal layer. For example, the interlayer insulating layers can be provided with a plurality of vias for connecting signal lines superimposed subsequently.

For example, a first source-drain metal layer and a planarization layer are further provided on the interlayer insulating layer, the first source-drain metal layer is provided with a plurality of connecting electrodes, and the planarization layer is provided with a plurality of vias for connection between the plurality of thin film transistors or connection of signal lines superimposed subsequently.

Figure 13A:
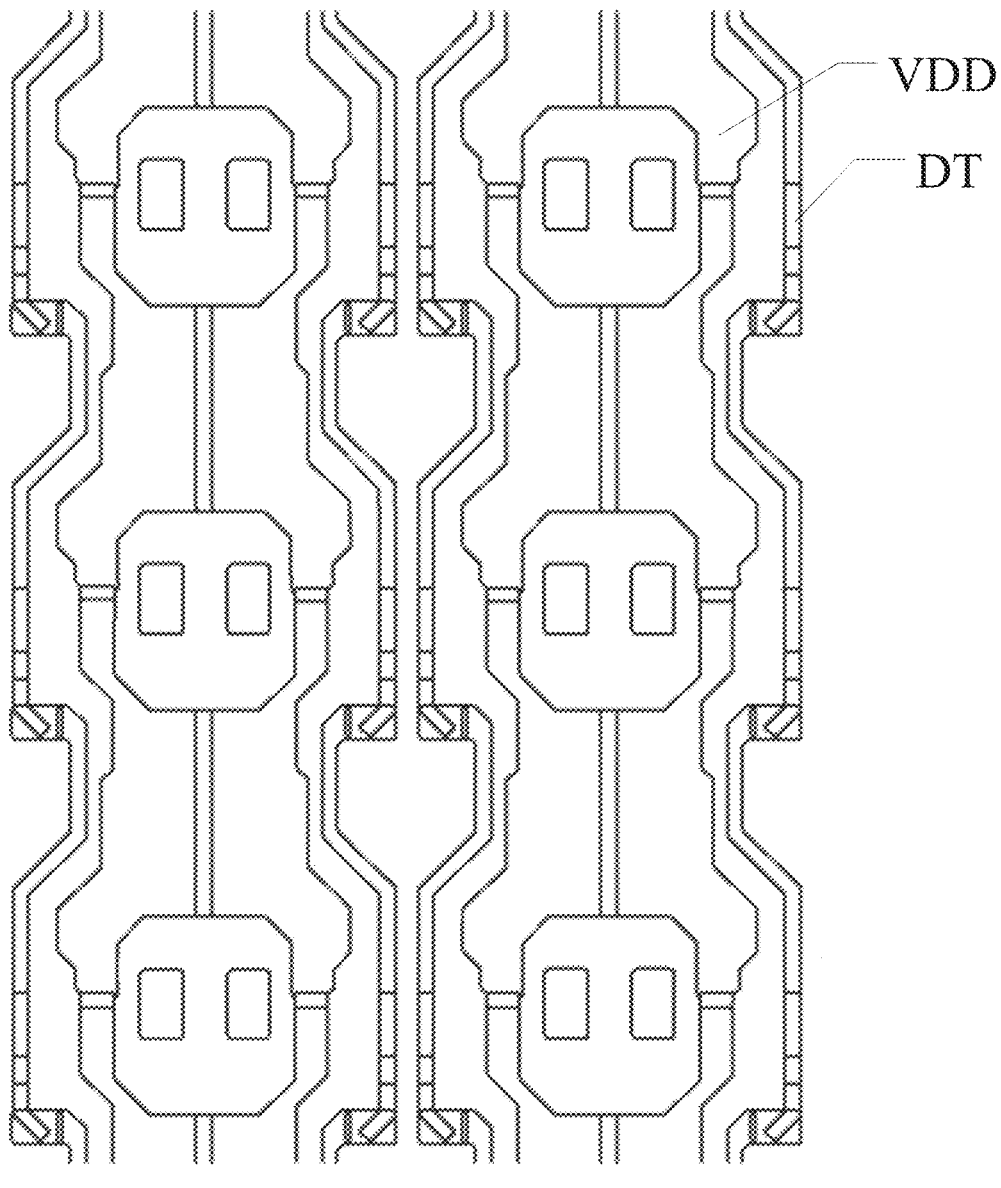
Figure 13B:
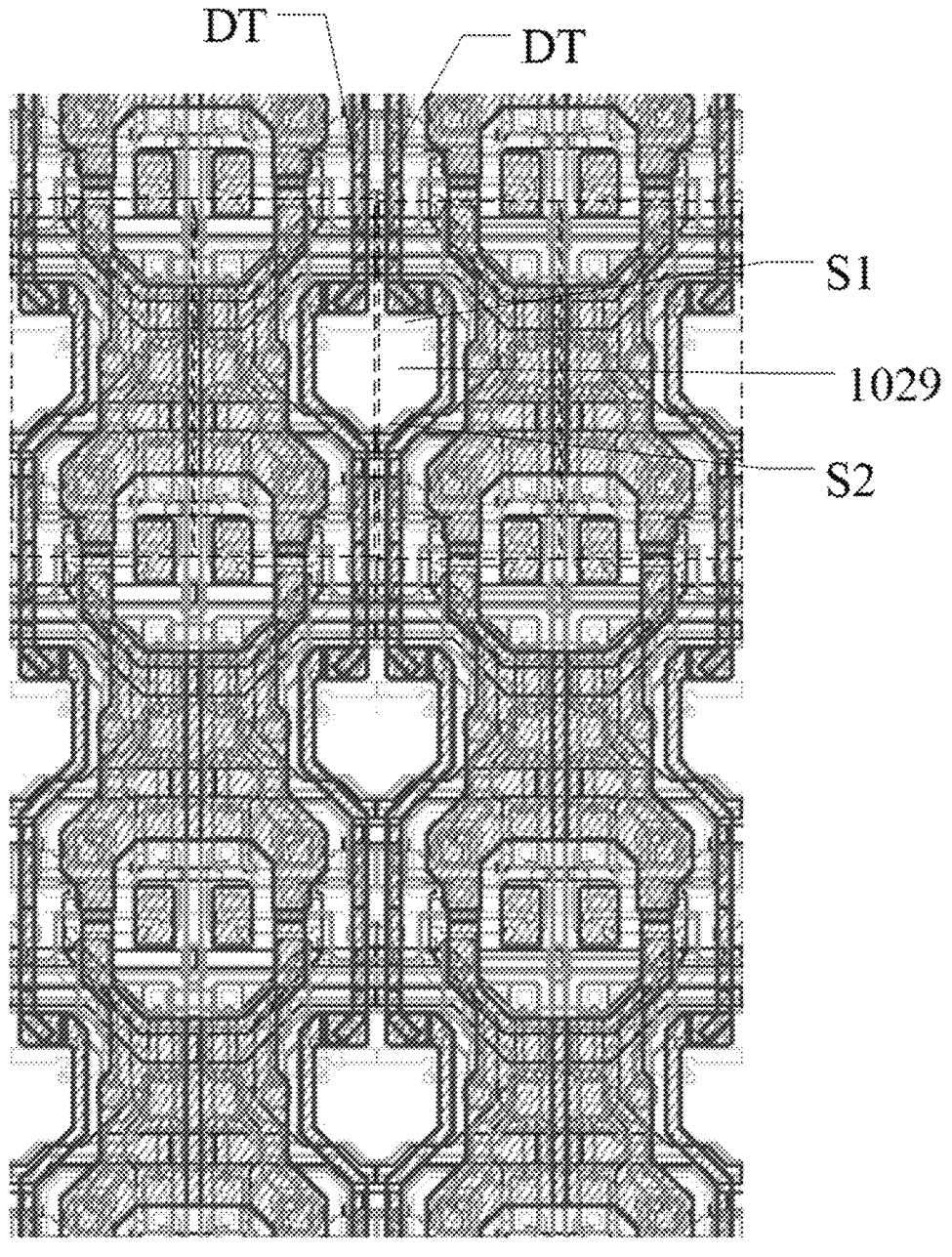

FIG. 13A shows a schematic diagram of a second source-drain metal layer of the display panel A second source-drain metal layer is arranged on the planarization layer, and FIG. 13B shows a schematic diagram of a second source-drain layer laminated on the planarization layer.

As illustrated by FIG. 13A and FIG. 13B, the second source-drain metal layer includes a plurality of power supply lines VDD and a plurality of data lines DT, the plurality of power supply lines VDD are respectively electrically connected with a plurality of columns of sub-pixels in one-to-one correspondence to provide power supply voltage, and the data lines DT are respectively electrically connected with the plurality of columns of sub-pixels in one-to-one correspondence to provide data signals.

For example, with reference to FIGS. 6A and 6B, the first terminal of the data writing circuit 126 is connected with the data line DT to receive the data signal, and the control terminal is connected with the first scanning signal line S1 to receive the first scanning signal. For example, the control terminal of the compensation circuit 128 is connected to the second scanning signal line S2 to receive the second scanning signal.

For example, a plurality of planarization layers are further provided on the second source-drain metal layer, and a plurality of vias are arranged in the planarization layers for connecting with the first electrode layer of the light-emitting device.

In some examples, as illustrated by FIG. 12 and FIG. 13B, an orthographic projection of the plurality of light-transmitting regions 1029 on the base substrate is respectively located between an orthographic projection of the first scanning signal line S1 and an orthographic projection of the second scanning signal line S2 which is closest to the first scanning signal line S1 on the base substrate.

For example, as illustrated by FIG. 12 and FIG. 13B, in the light-transmitting region 1029, there is no other conductive structure between the adjacent first scanning signal line S1 and the second scanning signal line S2, so that an area of the light-transmitting region 1029 can be set larger, thereby increasing the area of the photosensitive opening 1081, and further improving the photosensitive sensitivity of the photosensitive device.

For example, as illustrated by FIGS. 12 and 13B, the first scanning signal line S1 extends along the first direction X. and the second scanning signal line S2 extends along the first direction X. Portions of the first scanning signal line S1 and the second scanning signal line S2 that define the light-transmitting region 1029 are bent in directions away from each other to form avoidance. Therefore, the area of the light-transmitting region 1029 can be designed to be larger, so that the area of the photosensitive opening 1081 can be increased, and the photosensitive sensitivity of the photosensitive device can be further improved.

In some examples, as illustrated by FIGS. 13A and 13B, the orthographic projections of the plurality of light-transmitting regions 1029 on the base substrate are respectively located between orthographic projections of adjacent data lines DT on the base substrate. In the light-transmitting regions 1029, there are no pixel driving circuits between adjacent data lines DT. In FIG. 13B, four pixel driving circuits in a row are selected by using a dotted box. Therefore, the area of the light-transmitting region 1029 can be set to be larger, so that the area of the photosensitive opening 1081 can be increased, and the photosensitive sensitivity of the photosensitive device can be further improved.

For example, as illustrated by FIGS. 13A and 13B, the adjacent data lines DT both adjacent to one light-transmitting region 1029 extend along the second direction Y, and portions of the adjacent data lines DT that define one light-transmitting region 1029 are bent in directions away from each other to form avoidance. Therefore, the area of the light-transmitting region 1029 can be set to be larger, so that the area of the photosensitive opening 1081 can be increased, and the photosensitive sensitivity of the photosensitive device can be further improved.

For example, as illustrated by FIG. 13B, the first scanning signal lines S1, the second scanning signal lines S2 and the adjacent data lines DT jointly define the plurality of light-transmitting regions 1029, and regions surrounded by the first scanning signal lines S1, the second scanning signal lines S2 and the adjacent data lines DT are the plurality of light-transmitting regions 1029 of the driving circuit layer 102.

Figure 14:
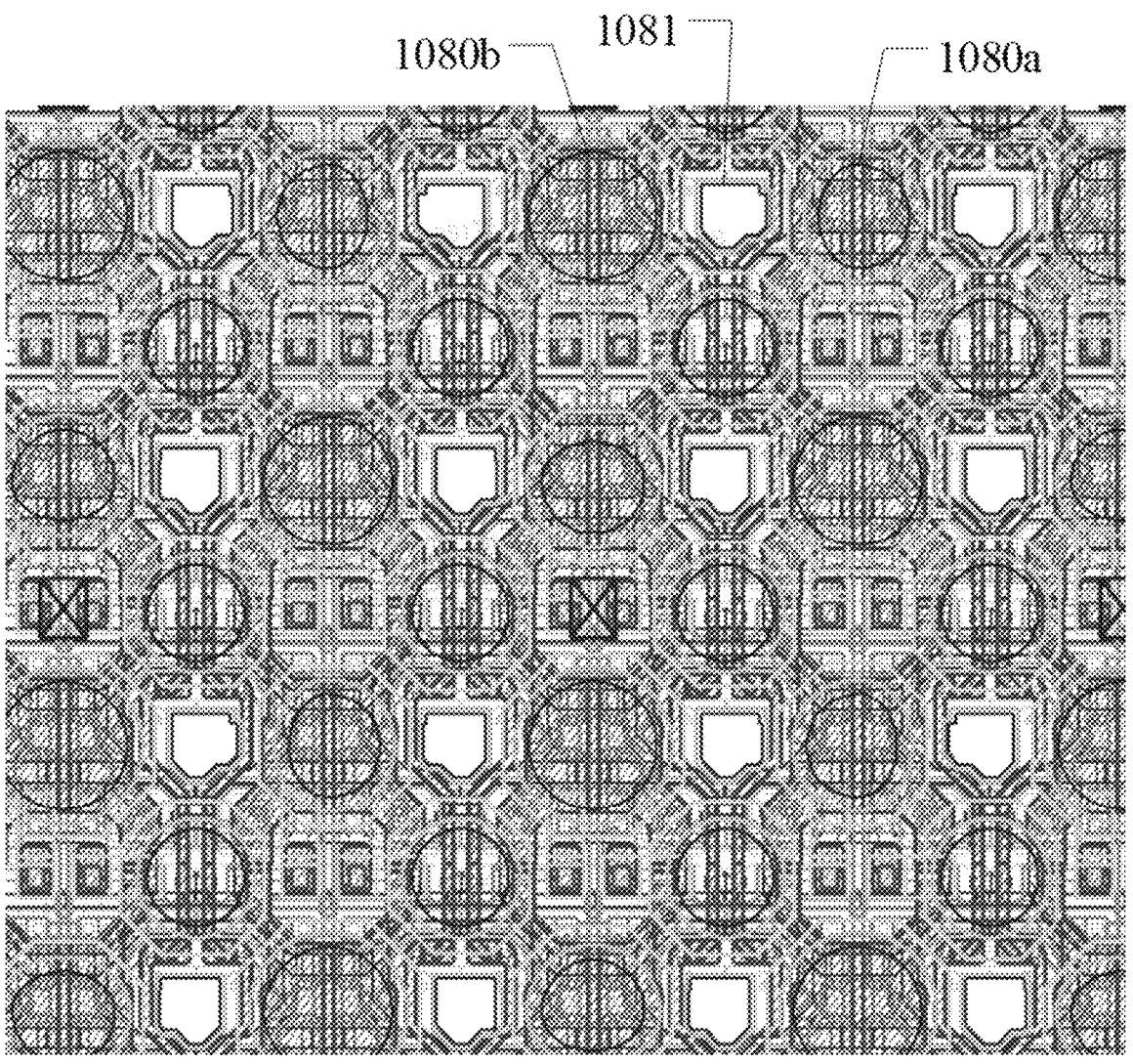

FIG. 14 shows a schematic diagram of a first electrode layer, a pixel defining layer and a black matrix laminated layer laminated on the driving circuit layer sequentially in the display panel. As illustrated by FIG. 13B and FIG. 14, the shape of the orthographic projection of the photosensitive opening 1081 on the base substrate is almost the same as the shape of the orthographic projection of the light-transmitting region 1029, and the orthographic projection of the photosensitive opening 1081 on the base substrate is located inside the orthographic projection of the light-transmitting region 1029 on the base substrate 101. Therefore, the light leakage of the driving circuit layer can be effectively prevented, and the area of the photosensitive opening 1081 can be increased, so that a proportion of the photosensitive opening 1081 occupying the light-transmitting region 1029 can be increased, and the photosensitive sensitivity of the photosensitive device on the non-display side can be improved.

In some examples, as illustrated by FIGS. 13B and 14, the photosensitive opening 1081 has a boundary at least partially similar to a boundary of the light-transmitting region 1029. For example, at least part of the boundary of the photosensitive opening 1081 is parallel to at least part of the boundary of the light-transmitting region 1029.

In some examples, as illustrated by FIGS. 13B and 14, a minimum distance between an edge of the photosensitive opening 1081 close to the first color sub-pixel opening 1080a and the light-transmitting region 1029 corresponding to the photosensitive opening 1081 is smaller than a minimum distance between an edge of the photosensitive opening 1081 close to the second color sub-pixel opening 1080b and the light-transmitting region 1029 corresponding to the photosensitive opening 1081.

In some examples, the base substrate may include a flexible insulating material such as PI (polyimide) or a rigid insulating material such as a glass substrate. For example, in some examples, the base substrate may be a laminated structure in which a plurality of flexible layers and a plurality of barrier layers are alternately arranged. In these cases, the flexible layer may include polyimide, and the barrier layer may include inorganic insulating materials such as silicon oxide, silicon nitride or silicon oxynitride. For example, the buffer layer 103 may include inorganic materials such as silicon nitride, silicon oxide and silicon oxynitride. The active layer 1021 can be made of polysilicon and metal oxide, the first gate insulating layer 1024 and the second gate insulating layer 1025 can be made of inorganic insulating materials such as silicon oxide, silicon nitride or silicon oxynitride, and the gate electrode 1022 and the first capacitor electrode C1 can be made of metal materials such as copper, aluminum, titanium, cobalt, etc. For example, they can be formed into a single-layer structure or a multi-layer structure, such as titanium/aluminum/titanium, molybdenum/aluminum/molybdenum, etc. The second capacitor electrode C2 can be made of metal or alloy materials such as copper, aluminum, titanium and cobalt, the interlayer insulating layer 1026 can be made of inorganic insulating materials such as silicon oxide, silicon nitride or silicon oxynitride, the passivation layer 1027 can be made of inorganic insulating materials such as silicon oxide, silicon nitride or silicon oxynitride, and the source electrode 1023 and drain electrode 1024 can be made of metal materials such as cuprum, aluminum, titanium and cobalt, which can be formed into a single-layer structure or a multi-layer structure, such as, titanium/aluminum/titanium, molybdenum/aluminum/molybdenum, etc. The first electrode layer 104 is an anode layer, for example, including metal oxides such as ITO and IZO or metals such as Ag, Al and Mo or their alloys. A material of the luminescent material layer 105 can be an organic luminescent material. For example, the luminescent material layer 105 can emit a certain color light (such as red light, blue light or green etc.) according to requirements. Of course, since the display panel according to the embodiment of the present disclosure further includes color film patterns of corresponding colors, the luminescent material layer 105 can also be a luminescent material that emits white light. The second electrode layer 106 is, for example, a cathode layer, including metals such as Mg, Ca, Li or Al or their alloys, or metal oxides such as IZO and ZTO, or organic materials with conductive properties such as PEDOT/PSS (poly 3,4-ethylenedioxythiophene/polystyrene sulfonate). The planarization layer 109, the pixel defining layer 108 and the spacer 107 can be made of organic insulating materials such as polyimide. The protective cover plate 115 may be a transparent cover plate such as a glass cover plate. The embodiment of the present disclosure does not specifically limit the materials of each functional layer.

An embodiment of the present disclosure further provides a display device. The display device includes the display panel provided in any of the above embodiments. Therefore, the display device has the beneficial effects corresponding to the beneficial effects of the display panel, which will not be described here.

Figure 15:
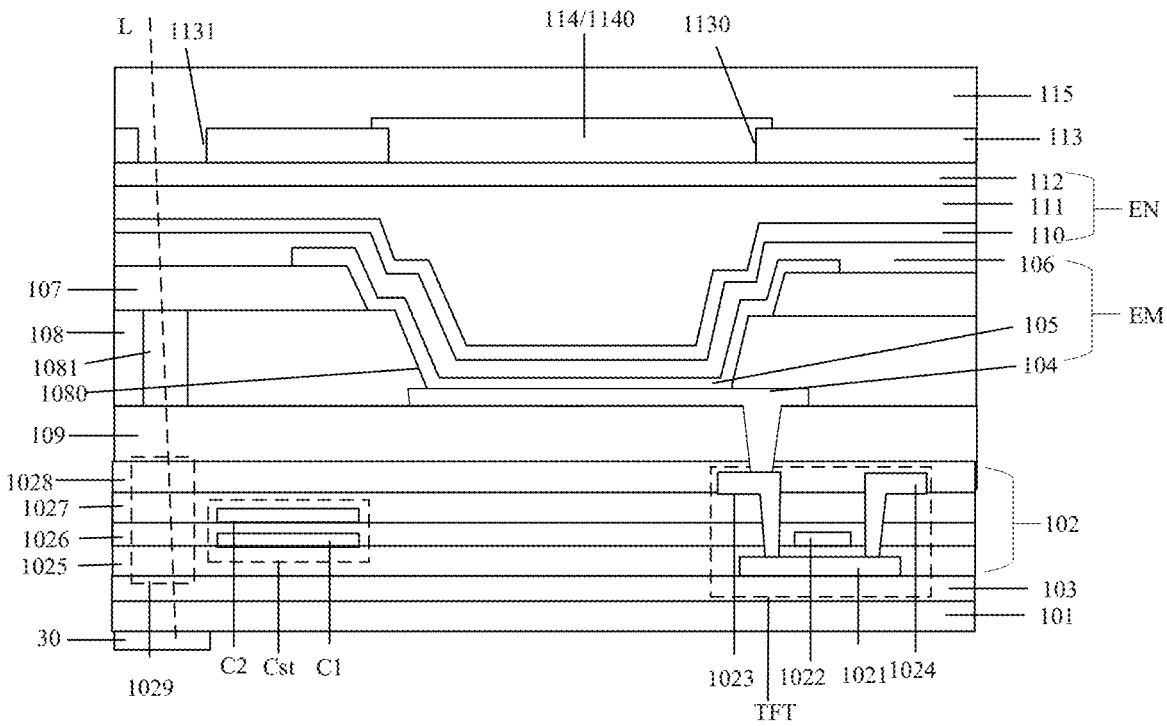
FIG. 15 is a schematic cross-sectional view of a display device provided by at least one embodiment of the present disclosure.

FIG. 15 is a schematic cross-sectional view of a display device provided by at least one embodiment of the present disclosure. As illustrated by FIG. 15, the display device further includes a photosensitive device 30 located on a non-display side of the display panel, and the photosensitive device 30 is configured to emit light L to a display side of the display panel through the light-transmitting region 1029 of the driving circuit layer 102. Or the photosensitive device 30 is configured to receive light L transmitted from the display side of the display panel to the non-display side of the display panel through the light-transmitting region 1029 of the driving circuit layer 102. Or the photosensitive device 30 is configured to emit the light L to the display side of the display panel through the light-transmitting region 1029 of the driving circuit layer 102 and to receive the light L transmitted from the display side of the display panel to the non-display side of the display panel through the light-transmitting region 1029 of the driving circuit layer 102.

For example, as illustrated by the figures, the photosensitive device 30 can be an infrared sensor, a distance sensor, a fingerprint identification module, a brightness level module, etc. Of course, the embodiment of the present disclosure includes but is not limited thereto.

In some examples, the display device can be a TV set, a notebook computer, a tablet computer, a mobile phone, a PDA (Personal Digital Assistant), a navigator, a wearable device, a VR (Virtual Reality) device and other products or components with display functions.

There are several points which should be noted. (1) In the drawings of the embodiments of the present disclosure, only the structures involved in the embodiments of the present disclosure are involved. Other structures can refer to the usual design. (2) The features in the same embodiment and different embodiments of the present disclosure can be combined with each other without conflict.

The above are only the specific implementations of the present disclosure, but the scope of protection of the present disclosure is not limited thereto. Any person skilled in the art can easily conceive of variations or substitutions within the technical scope disclosed in the present disclosure, which should be included in the scope of protection of the present disclosure. Therefore, the scope of protection of the present disclosure shall be based on the scope of protection of the claims.

The invention claimed is:

1. A display panel, comprising:
   a base substrate;
   a driving circuit layer, disposed on the base substrate and comprising a plurality of pixel driving circuits;
   a light-emitting device layer, disposed on a side of the driving circuit layer away from the base substrate and comprising a plurality of light-emitting devices; and
   a color film layer, disposed on a side of the light-emitting device layer away from the base substrate and comprising a plurality of color film patterns, wherein the display panel comprises a plurality of sub-pixels, each of the plurality of sub-pixels comprises at least one pixel driving circuit in the driving circuit layer, at least one light-emitting device in the light-emitting device layer and at least one color film pattern in the color film layer, the plurality of color film patterns comprises a plurality of first color film patterns, a plurality of second color film patterns and a plurality of third color film patterns, so that the plurality of sub-pixels forms a plurality of first color sub-pixels, a plurality of second color sub-pixels and a plurality of third color sub-pixels, light-emitting regions of the plurality of first color sub-pixels and light-emitting regions of the plurality of second color sub-pixels are alternately arranged along a first direction parallel to the base substrate to form a plurality of first sub-pixel rows; light-emitting regions of the plurality of third color sub-pixels are arranged along the first direction to form a plurality of second sub-pixel rows, the first sub-pixel rows and the second sub-pixel rows are alternately arranged along a second direction parallel to the base substrate and intersecting the first direction, the plurality of first sub-pixel rows and the plurality of second sub-pixel rows comprise a sub-pixel row group consisting of one first sub-pixel row, one second sub-pixel row, one first sub-pixel row, one second sub-pixel row and one first sub-pixel row which are sequentially and continuously arranged, the first sub-pixel row in a middle of the sub-pixel row group is a middle first sub-pixel row, the two second sub-pixel rows in the sub-pixel row group are adjacent second sub-pixel rows, and the two outermost first sub-pixel rows in the sub-pixel row group is outer first sub-pixel rows, the first color film pattern of the first color sub-pixel in the middle first sub-pixel row extends across the adjacent second sub-pixel row and further extends to the outer first sub-pixel row.

2. The display panel according to claim 1, wherein the first color film pattern of the first color sub-pixel in the middle first sub-pixel row overlaps with the third color film pattern of a third color sub-pixel, which is closest to the first color sub-pixel, in the adjacent second sub-pixel row, and overlaps with the second color film pattern of a second color sub-pixel, which is closest to the first color sub-pixel, in the outer first sub-pixel row.

3. The display panel according to claim 2, wherein the first color film pattern of the first color sub-pixel in the middle first sub-pixel row overlaps with the third color film patterns of two third color sub-pixels in the adjacent second sub-pixel row on a side of the middle first sub-pixel row, and overlaps with the third color film patterns of two third color sub-pixels in the adjacent second sub-pixel row on the other side of the middle first sub-pixel row.

4. The display panel according to claim 1, wherein the first color film pattern of each of the plurality of first color sub-pixels in the middle first sub-pixel row is continuously distributed.

5. The display panel according to claim 1, wherein, in the sub-pixel row group, a straight line along the second direction and passing through a center of the first color film pattern in the middle first sub-pixel row passes through the second color film pattern in the outer first sub-pixel row, a straight line along the second direction and passing through a center of the second color film pattern in the middle first sub-pixel row passes through the first color film pattern in the outer first sub-pixel row.

6. The display panel according to claim 5, wherein, in the sub-pixel row group, a straight line along the second direction and passing through a center of the third color film pattern in the adjacent second sub-pixel row is located between the first color film pattern and the second color film pattern in the outer first sub-pixel row and also between the first color film pattern and the second color film pattern in the middle first sub-pixel row.

7. The display panel according to claim 6, wherein, in the sub-pixel row group, the first color film pattern of the first color sub-pixel in the middle first sub-pixel row extends to between the light-emitting regions of a second color sub-pixel and a third color sub-pixel adjacent to each other and located in the adjacent second sub-pixel row and the outer first sub-pixel row.

8. The display panel according to claim 7, wherein, in the sub-pixel row group, a line connecting centers of the light-emitting regions of the second color sub-pixel and the third color sub-pixel adjacent to each other does not overlap with the first color film pattern.

9. The display panel according to claim 2, wherein, in an overlapping region of the first color film pattern and the second color film pattern, the first color film pattern is located on a side of the second color film pattern away from the base substrate, in an overlapping region of the first color film pattern and the third color film pattern, the first color film pattern is located on a side of the third color film pattern away from the base substrate.

10. The display panel according to claim 1, wherein the first color sub-pixel is a red sub-pixel, the second color sub-pixel is a blue sub-pixel and the third color sub-pixel is a green sub-pixel.

11. The display panel according to claim 1, further comprising:

a black matrix layer, disposed on a side of the light-emitting device layer away from the base substrate, wherein the black matrix layer comprises a plurality of avoidance openings that respectively expose the light-emitting regions of the light-emitting devices of the plurality of sub-pixels in a direction perpendicular to the base substrate, and the plurality of avoidance openings comprise a plurality of first avoidance openings, a plurality of second avoidance openings and a plurality of third avoidance openings that respectively correspond to the plurality of first color sub-pixels, the plurality of second color sub-pixels and the plurality of third color sub-pixels, the plurality of first color film patterns, the plurality of second color film patterns and the plurality of third color film patterns of the plurality of color film patterns respectively cover the plurality of first avoidance openings, the plurality of second avoidance openings and the plurality of third avoidance openings.

12. The display panel according to claim 11, wherein a minimum distance between a boundary of an orthographic projection of the color film pattern on the base substrate and a boundary of an orthographic projection of the avoidance opening covered by the color film pattern on the base substrate is greater than or equal to 4 $\mu m$.

13. The display panel according to claim 11, wherein the driving circuit layer comprises a plurality of light-transmitting regions, and the black matrix layer further comprises a plurality of light-transmitting openings, each of the plurality of light-transmitting openings is disposed corresponding to at least one of the plurality of light-transmitting regions for transmitting light having a predetermined angle range relative to the display panel and required for a photosensitive device arranged on a non-display side of the display panel, the light-transmitting opening is located between the first avoidance opening and the second avoidance opening adjacent in the first direction, in a direction perpendicular to the base substrate, the color film pattern does not overlap with the light-transmitting opening.

14. The display panel according to claim 13, wherein, in the sub-pixel row group, a part of the first color film pattern of the first color sub-pixel in the middle first sub-pixel row extends to between the light-transmitting opening and the light-emitting region of the third color sub-pixel adjacent to each other, and the part of the first color film pattern overlaps with the third color film pattern of the third color sub-pixel in the second direction.

15. The display panel according to claim 13, further comprising a planarization layer disposed on a side of the driving circuit layer away from the base substrate and a pixel defining layer disposed on a side of the planarization layer away from the base substrate, wherein the pixel defining layer comprises a plurality of sub-pixel openings and a plurality of photosensitive openings, the light-emitting device comprises a first electrode layer, a luminescent material layer and a second electrode layer which are sequentially laminated in a direction away from the base substrate, the first electrode layer is disposed on a side of the planarization layer away from the base substrate, the pixel defining layer is disposed on a side of the first electrode layer away from the base substrate, and the plurality of sub-pixel openings respectively expose the first electrode layers of the light-emitting devices of the plurality of sub-pixels, and the plurality of sub-pixel openings define the light-emitting regions of the plurality of sub-pixels, for one sub-pixel opening and one avoidance opening both corresponding to one same sub-pixel, an orthographic projection of the sub-pixel opening on the base substrate is located inside an orthographic projection of the avoidance opening on the base substrate, for one photosensitive opening and one light-transmitting opening both corresponding to one same light-transmitting region, an orthographic projection of the photosensitive opening on the base substrate is located inside an orthographic projection of the light-transmitting opening on the base substrate.

16. The display panel according to claim 15, wherein the plurality of sub-pixel openings comprise a plurality of first color sub-pixel openings corresponding to the plurality of first color sub-pixels, a plurality of second color sub-pixel openings corresponding to the plurality of second color sub-pixels, and a plurality of third color sub-pixel openings corresponding to the plurality of third color sub-pixels, an orthographic projection of the first color sub-pixel opening on the base substrate is substantially elliptical, the first sub-pixel rows comprise a first type of first sub-pixel row, and an ellipse long axis of the first color sub-pixel opening in the first type of first sub-pixel row extends substantially along the first direction, in the first type of first sub-pixel row, two photosensitive openings both adjacent to the first color sub-pixel opening are symmetrical about a straight line where an ellipse short axis of the first color sub-pixel opening is located, and two photosensitive openings both adjacent to the second color sub-pixel opening are symmetrical about a straight line along the second direction and passing through a center of the second color sub-pixel opening.

17. The display panel according to claim 16, wherein the first sub-pixel rows comprise a second type of first sub-pixel row, and an ellipse long axis of the first color sub-pixel opening in the second type of first sub-pixel row extends substantially along the second direction, in the second type of first sub-pixel row, two photosensitive openings both adjacent to the second color sub-pixel opening are symmetrical about a straight line along the second direction and passing through a center of the second color sub-pixel opening, wherein a maximum dimension of the photosensitive opening between the sub-pixels in the second type of first sub-pixel row in the first direction is greater than a maximum dimension of the photosensitive opening between the sub-pixels in the first type of first sub-pixel row in the first direction.

18. The display panel according to claim 16, wherein an opening area of the second color sub-pixel opening is larger than an opening area of the first color sub-pixel opening, a minimum distance between an edge of the photosensitive opening close to the first color sub-pixel opening and the light-transmitting region corresponding to the photosensitive opening is smaller than a minimum distance between an edge of the photosensitive opening close to the second color sub-pixel opening and the light-transmitting region corresponding to the photosensitive opening.

19. The display panel according to claim 14, further comprising:

a touch layer, arranged on a side of the pixel defining layer away from the base substrate, the touch layer comprises a plurality of touch lines, and orthographic projections of the plurality of touch lines on the base substrate are staggered from the orthographic projections of the plurality of avoidance opening and the orthographic projections of the plurality of light-transmitting opening on the base substrate, and the plurality of touch lines are arranged crosswise to form a mesh structure, a minimum distance between a boundary of the orthographic projection of the touch line on the base substrate and a boundary of the orthographic projection of the light-transmitting opening on the base substrate is greater than or equal to 1.7 μm, and a minimum distance between the boundary of the orthographic projection of the touch line on the base substrate and a boundary of the orthographic projection of the avoidance opening on the base substrate is greater than or equal to 1.7 μm.

20. A display device, comprising the display panel according to claim 1.

* * * * *